(12) United States Patent
Laity et al.

(10) Patent No.: US 6,183,307 B1
(45) Date of Patent: Feb. 6, 2001

(54) PC CARDS WITH INTEGRATED I/O COMMUNICATION RECEPTACLES

(75) Inventors: Ian A. Laity, Simi Valley; Gerald Pepper, Thousand Oaks; James G. Hughes, Simi Valley; Donald C. Barrett, Camarillo; Frank McLinn, Simi Valley, all of CA (US)

(73) Assignee: Xircom, Inc., Thousand Oaks, CA (US)

( * ) Notice: Under 35 U.S.C. 154(b), the term of this patent shall be extended for 0 days.

(21) Appl. No.: 09/479,743

(22) Filed: Jan. 7, 2000

Related U.S. Application Data

(63) Continuation-in-part of application No. 09/048,143, filed on Mar. 25, 1998, which is a continuation-in-part of application No. 08/971,501, filed on Nov. 17, 1997, now Pat. No. 5,984,731.
(60) Provisional application No. 60/125,296, filed on Mar. 19, 1999.

(51) Int. Cl.$^7$ .................................................. H01R 24/00
(52) U.S. Cl. ...................... 439/676; 439/76.1; 439/639; 439/946; 361/686; 361/737
(58) Field of Search ..................... 439/676, 76.1, 439/638, 946, 946.2, 95, 101; 361/737, 686, 785

(56) References Cited

U.S. PATENT DOCUMENTS

| | | | |
|---|---|---|---|
| 5,562,463 | * 10/1996 | Tan | 439/946 |
| 5,667,395 | * 9/1997 | Okada et al. | 439/946 |
| 5,679,013 | * 10/1997 | Matsunaga et al. | 439/946 |
| 5,692,914 | * 12/1997 | Mitani et al. | 439/946 |

* cited by examiner

Primary Examiner—Paula Bradley
Assistant Examiner—Tho D. Ta
(74) Attorney, Agent, or Firm—Hogan & Hartson L.L.P.

(57) ABSTRACT

A PC Card is provided which can be inserted in the PCMCIA slot of a host system either right side up or inverted. The card includes a front portion conforming to the PCMCIA Type II thickness standard and a rear portion conforming to the PCMCIA Type III thickness standard. The card is so configured that two cards can be stacked in complementary fashion and inserted in a host system Type III slot, one card thus being connected to one of the 68-pin slot connectors and the other card being connected to the other 68-pin slot connector. Circuitry is provided for use in an invertible PC Card for electronically detecting the presence, type and orientation of the card, for managing power supply voltages and for directing, or, if the card is inverted, for redirecting the signals appearing at the various pins of the card connector as necessary. Such circuitry comprises an application specific integrated circuit (ASIC) incorporating, besides the card function circuits, an orientation detection state machine and a signal mutliplexer.

21 Claims, 33 Drawing Sheets

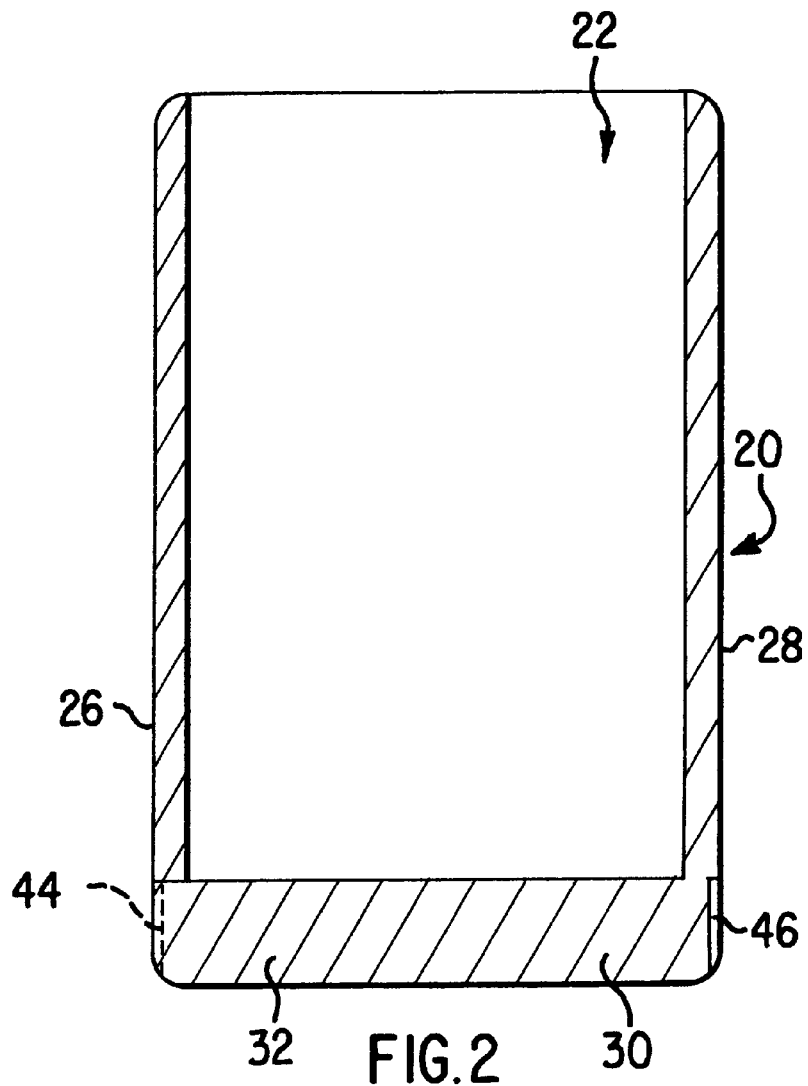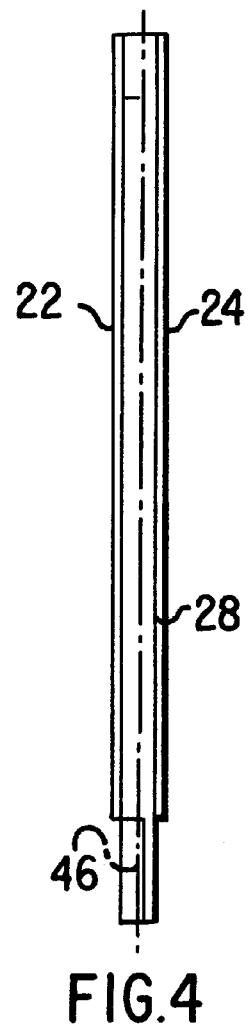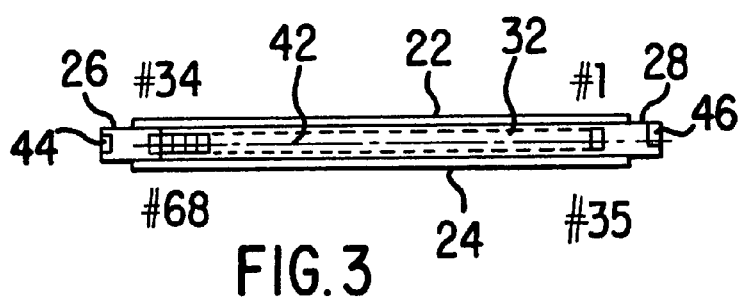

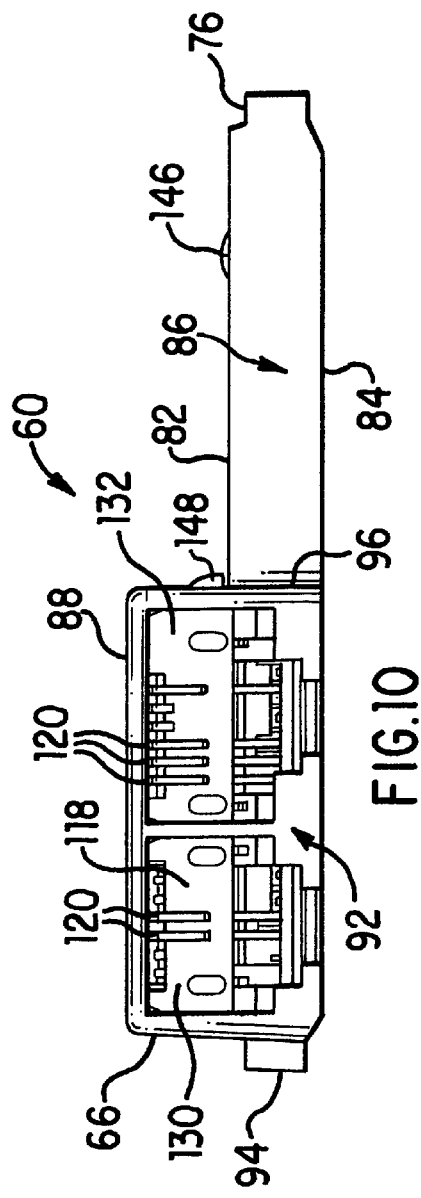
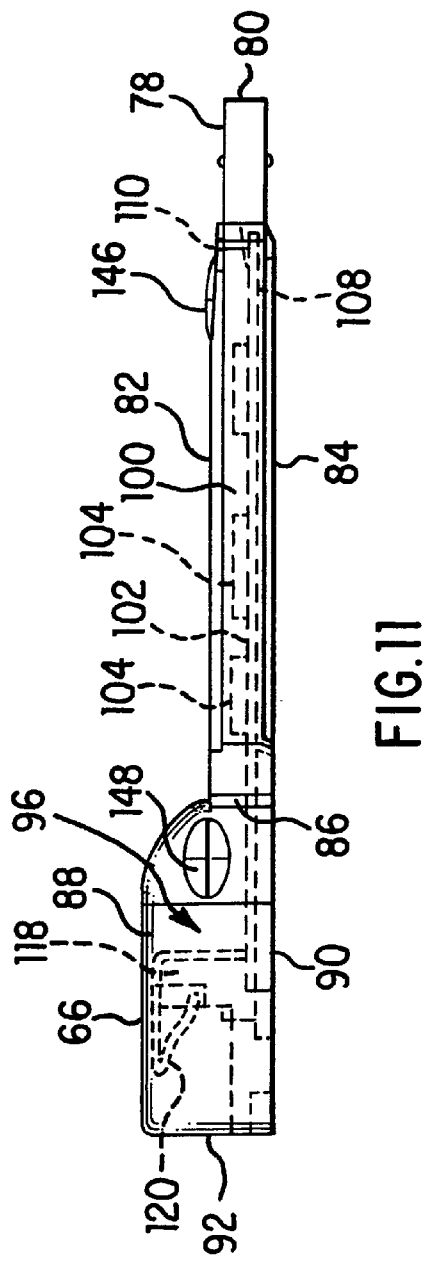

16-BIT PC CARD PIN ASSIGNMENTS

| PIN NUMBER | SIGNAL NAME | DIRECTION | PIN NUMBER | SIGNAL NAME | DIRECTION |
|---|---|---|---|---|---|
| 01 | GND |   | 68 | GND |   |
| 02 | DATA03 | B | 67 | CD2# |   |
| 03 | DATA04 | B | 66 | DATA10 | B |
| 04 | DATA05 | B | 65 | DATA09 | B |
| 05 | DATA06 | B | 64 | DATA08 | B |
| 06 | DATA07 | B | 63 | StsChg | B |
| 07 | CE1# | I | 62 | SPkrN | O |
| 08 | ADDR10 | I | 61 | REG# | I |
| 09 | OE# | I | 60 | INPACKN | T |
| 10 | ADDR11 | I | 59 | WAIT# | O |
| 11 | ADR09 | I | 58 | RESET | I |
| 12 | ADDR08 | I | 57 | VS2# |   |
| 13 | ADDR13 | I | 56 | ADDR25 | I |
| 14 | ADDR14 | I | 55 | ADDR24 | I |
| 15 | WE# | I | 54 | ADDR23 | I |
| 16 | READY | O | 53 | ADDR22 | I |
| 17 | VCC |   | 52 | VPP2 |   |
| 18 | VPP1 |   | 51 | VCC |   |
| 19 | ADDR16 | I | 50 | ADDR21 | I |
| 20 | ADDR15 | I | 49 | ADDR20 | I |
| 21 | ADDR12 | I | 48 | ADDR19 | I |
| 22 | ADDR07 | I | 47 | ADDR18 | I |
| 23 | ADDR06 | I | 46 | ADDR17 | I |
| 24 | ADDR05 | I | 45 | IOWRN | I |
| 25 | ADDR04 | I | 44 | IORDN | I |
| 26 | ADDR03 | I | 43 | VS1# |   |
| 27 | ADDR02 | I | 42 | CE2# | I |
| 28 | ADDR01 | I | 41 | DATA15 | B |
| 29 | ADDR00 | I | 40 | DATA14 | B |
| 30 | DATA00 | B | 39 | DATA13 | B |
| 31 | DATA01 | B | 38 | DATA12 | B |
| 32 | DATA02 | B | 37 | DATA11 | B |
| 33 | IOIS16N | O | 36 | CD1# |   |
| 34 | GND |   | 35 | GND |   |

FIG. 26

32-BIT CARDBUS PC CARD PIN ASSIGNMENTS

| PIN NUMBER | SIGNAL NAME | DIRECTION | PIN NUMBER | SIGNAL NAME | DIRECTION |
|---|---|---|---|---|---|
| 01 | GND | | 68 | GND | |
| 02 | CAD0 | B | 67 | CD2 | O |
| 03 | CAD1 | B | 66 | CAD31 | B |
| 04 | CAD3 | B | 65 | CAD30 | B |
| 05 | CAD5 | B | 64 | CAD28 | B |
| 06 | CAD7 | B | 63 | CSTSCHG | T |
| 07 | CC/BE0# | B | 62 | CAUDIO# | O |
| 08 | CAD9 | B | 61 | CC/BE3# | B |
| 09 | CAD11 | B | 60 | CREQ# | T |
| 10 | CAD12 | B | 59 | CSERR# | B |
| 11 | CAD14 | B | 58 | CRSTN | I |
| 12 | CC/BE1# | B | 57 | VS2 | I |
| 13 | CPAR | B | 56 | CAD19 | B |
| 14 | CPERR# | B | 55 | CAD17 | B |
| 15 | CGNT# | I | 54 | CFRAME# | B |
| 16 | CINT# | T | 53 | CTRDY# | B |
| 17 | VCC | | 52 | VPP2 | |
| 18 | VPP1 | | 51 | VCC | |
| 19 | CCLK | I | 50 | CDEVSEL# | B |
| 20 | CIRDY# | B | 49 | CSTOP# | B |
| 21 | CC/BE2# | B | 48 | CBLOCK# | I |
| 22 | CAD18 | B | 47 | RFU | |
| 23 | CAD20 | B | 46 | CAD16 | B |
| 24 | CAD21 | B | 45 | CAD15 | B |
| 25 | CAD22 | B | 44 | CAD13 | B |
| 26 | CAD23 | B | 43 | VS1 | I |
| 27 | CAD24 | B | 42 | CAD10 | B |
| 28 | CAD25 | B | 41 | CAD8 | B |
| 29 | CAD26 | B | 40 | RFU | |
| 30 | CAD27 | B | 39 | CAD6 | B |
| 31 | CAD29 | B | 38 | CAD4 | B |
| 32 | RFU | | 37 | CAD2 | B |
| 33 | CCLKRUN# | B | 36 | CD1 | |
| 34 | GND | | 35 | GND | |

FIG. 27

PC CARDS WITH INTEGRATED I/O COMMUNICATION RECEPTACLES

CROSS REFERENCE TO RELATED APPLICATIONS

This application claims the benefit of U.S. provisional application Serial No. 60/125,296 filed Mar. 19, 1999. This application is also a continuation-in-part of U.S. application Ser. No. 09/048,143 filed Mar. 25, 1998, which is in turn a continuation-in-part of U.S. application Ser. No. 08/971,501 filed Nov. 17, 1997, now U.S. Pat. No. 5,984,731 issued Nov. 16, 1999. Each of the aforementioned applications and patent is incorporated herein by reference.

FIELD OF THE INVENTION

This invention relates generally to removable input/output (I/O) devices of the type used with host systems such as desktop and portable personal computers, peripherals, and the like, for directly connecting the host system to an information transfer system using standard modular communications plugs.

BACKGROUND OF THE INVENTION

As is well known, many of today's laptop, notebook, desktop and other computers, as well as computer peripherals and other electronic products, are designed to receive removable devices such as cards conforming to the PC Card Standard established by the Personal Computer Memory Card International Association (PCMCIA), 2635 N. First Street, Suite 209, San Jose, Calif. 95131 (U.S.A.). The PC Card Standard, including the latest release (March 1997), is incorporated herein by reference in its entirety. The PC Card Standard defines the electrical and physical specifications of the PC Card including the interfaces between the card and the port or slot into which the card is inserted. The specifications include a 16-bit PC Card interface and a 32-bit CardBus PC Card interface. The Standard also enables 3.3 and 5 volt operation. A physical keying mechanism for 3.3 volt cards protects them from being damaged in a 5 volt host system slot. The PCMCIA standard also specifies three card form factors, called Type I, Type II and Type III. All three card types measure the same length (85.6 mm) and the same width (54.0 mm), and differ only in overall thickness. Thus, the Type I card has a thickness of 3.3 mm; the Type II card, 5.0 mm; and the Type III card, 10.5 mm. PC cards may be used for various purposes. For example, Type I cards are typically used for memory devices; Type II cards are typically used for I/O devices, as will be described below; and Type III cards have been typically used to house rotating mass storage devices (disk drives). Presently, Type II cards are used principally as communication links, for example, for connecting the user of a host system such as a portable computer to an Ethernet LAN, as a data/fax modem for connecting the user to a subscriber telephone line system, or as a combined LAN and modem card. In one popular arrangement an adapter cable is used to couple the relatively thin Type II card to the much larger, standard RJ-11 or RJ-45 receptacle of a telephone line or Ethernet network. A drawback of this arrangement is that besides the computer, one or more bulky adapter cables must be carried by the user in order to connect the computer to a LAN or telephone line system thereby defeating at least to some extent the advantages afforded by portable computers. In addition, these adapter cables are often lost. Another disadvantage of adapter cables is that the connection between the thin card and the cable is fragile and subject to electrical contact interruption and consequent loss of data transfer.

One solution to the problem of incompatibility between the PC Type II standard communications card and the RJ-type connector is to add to the rear end of the Type II card an enlarged housing enclosing a receptacle sized and configured to receive an RJ-type connector plug. The incorporation of such an RJ receptacle housing allows the 5 mm Type II communications card to interface directly with a LAN or telephone system using an existing LAN or telephone cable with an RJ-11 or RJ-45 modular plug at each end. However, although this approach eliminates the need for a separate adapter cable assembly, the housing on the end of the card for receiving the RJ-type connector projects from the host system enclosure often requiring the removal of the card when transporting a portable computer in an attache case or the like.

Another approach to the elimination of the need for external adapter cables is a communications card that allows an RJ-type modular plug to be inserted directly into an aperture formed in a retractable access portion of a Type II communications card. Such an approach is disclosed, for example, in U.S. Pat. No. 5,183,404 issued Feb. 2, 1993. Yet another approach to eliminating the need for adapter cables is disclosed in U.S. Pat. No. 5,773,332 issued Jun. 30, 1998 and incorporated herein by reference. FIG. 21 of U.S. Pat. No. 5,773,332 shows a Type III card incorporating in the rear thereof a pair of RJ-xx series receptacles (specifically an RJ-11 receptacle and an RJ-45 receptacle) for directly connecting the card to a LAN network and/or telephone line.

The typical host system card slot has a height conforming to the Type III standard (10.5 mm) that can accommodate two stacked Type II PC cards each 5.0 mm thick, or a single Type III card. The slot includes longitudinally extending upper and lower channel pairs, each pair adapted to receive the longitudinal side rails of one of the cards. As is known, each card has a conventional 68-contact connector at one end that is adapted to mate with a corresponding 68-pin connector along the rear wall of the host system slot when the card is fully inserted in the slot. A slot that can accommodate two Type II cards will therefore have a pair of stacked 68-pin connectors, that is, an upper and a lower host connector, one for each card connector. A key, dimensioned and configured in accordance with the PC Card Standard, is provided along the front end of each of the longitudinal sides of the card to prevent the card from being completely inserted in the slot upside down and to protect a 3.3 volt card from being plugged into and thereby damaged by a 5 volt slot.

One of the advantages of Type III communication cards of the kind disclosed in the aforementioned patents and application is that the rear receptacles on such cards can directly receive standard modular plugs such as the RJ-11 and RJ-45 plugs on existing cables, thereby eliminating the need for adapters (also known as "dongles"). However, each such card is provided with a specific receptacle or combination of receptacles thereby requiring the purchase of a new card in order to upgrade and/or add a new communication function. The purchase of an additional card either makes the first card redundant or the use of the cards inconvenient since the original card and the new card cannot be used in the same slot simultaneously.

It would therefore be desirable to provide for greater flexibility in the combination of communication card functions available to the user at a reasonable cost.

SUMMARY OF THE INVENTION

In accordance with one specific embodiment of the present invention, there is provided a PC Card that combines Type II and Type III form factors in such a fashion that the configurations of two of such cards complement each other and can be stacked and inserted in the host system slot so as to be connectable to both 68-pin host connectors. Various combinations of multiple receptacles (for example, RJ-11, RJ-45 and GSM cellular) may thus be made available. Moreover, one such card can be used by itself. Thus, a user might initially purchase a single, low cost, single function card. One or more additional functions can then be subsequently added by purchasing a second card that may be simultaneously used, in the same slot, with the first card.

More specifically, in accordance with one specific exemplary form of the invention, there is provided a PC Card adapted to be received by a slot in a host system for connecting the host system to an information transfer system, the card including a housing having a first part and a second part, the first part of the housing having parallel longitudinal sides, a longitudinally extending centerline, a first transverse end including a connector adapted to mate with a corresponding host connector within the slot of the host system, and a second, generally transverse end. The first part of the housing has a thickness conforming substantially to the Type II PC Card thickness standard and encloses a substrate carrying electronic circuit components, the connector at the first transverse end of the housing being electrically coupled to the circuit elements. The second part of the housing has parallel top and bottom outer surfaces and is attached to the second transverse end of the first part of the housing and conforms substantially to the Type III PC Card thickness standard. The second part of the housing defines at least one receptacle sized, configured and oriented to receive a standard plug in a direction generally parallel to the top and bottom surfaces of the second part of the housing. The at least one receptacle includes contacts so that the PC Card is adapted to be directly connectable to the information transfer system utilizing a standard plug. The second part of the housing has a width no greater than about one-half the width of the first part of the housing and is disposed to one side of the longitudinal centerline of the first part of the housing.

In accordance with another specific aspect of the invention, the second part of the housing has a transverse end disposed substantially parallel with the first transverse end of the first part of the housing. The at least one receptacle extends toward the first transverse end so that the standard plug is received by the receptacle in a direction generally parallel with the longitudinal axis.

The parallel longitudinal sides of the first part of the housing define a width conforming substantially to the PC Card width standard.

Pursuant to yet another aspect of the present invention, the PC Card has an overall length extending from the first transverse end of the first part of the housing to the transverse end of the second part of the housing, the overall length conforming to the PC Card length standard.

It will thus be seen that in plan view, in the specific embodiment of the card that has been described, the Type III part of the card is to one side of the longitudinal centerline and has a width no more than about half the width of the Type II part. A single card of the invention can be inserted in either the top or bottom channels of the PC Card slot in the host system so as to be coupled to either the top or bottom 68-pin host connector. In one of these positions, however, the card will be inverted.

It will further be appreciated that two cards in accordance with the invention can be stacked in complementary fashion with the Type III part of one card occupying or nested within the space adjacent the Type III part of the other card. Thus, the overall thickness of the stacked cards is that of a Type III card with the 68-contact connector of each card receiving one of the 68-pin host connectors. The stacked cards can be inserted in the slot in either orientation.

Accordingly, pursuant to yet another aspect of the invention, a card according to the present invention can be inserted right side up or upside down in the host system slot. To make such inversion possible, the keys normally found along the front extremities of the longitudinal sides of conventional PC Cards are eliminated. However, although the 68-position connector contact and pin arrays are physically symmetrical about vertical and horizontal center lines, the pin assignments are not electrically symmetrical. Thus, circuitry is included within the card of the invention for electronically detecting the presence, type and orientation of the card, for managing power supply voltages and for directing (or redirecting, if the card is inverted) the signals appearing at the various pins of the card connector as necessary. In accordance with this aspect of the invention, such circuitry comprises an application specific integrated circuit (ASIC) incorporating, besides the card function circuits, an orientation detection state machine and a signal mutliplexer. The orientation detection state machine generates orientation control signals (Card_Flipped or Card_Not_Flipped) in response to certain bus interface control signals in the case of a 16-bit card, and to the host system clock signal in the case of a 32-bit card. The signal multiplexer directs or redirects (in the case of card inversion) the card interface signals to the card function circuits in response to the orientation signals generated by the orientation detection state machine. First circuitry external to the ASIC signals the host system that a card has been inserted into the host system PC Card slot and allows the host system to identify the card bus type (16-bit or 32-bit) and supply voltage requirements (5 volts or 3.3 volts). Second circuitry external to the ASIC and responsive to the orientation signals generated by the orientation detection state machine, manages power supply connections between the host system and the card for either orientation. Importantly, no modification of the host system hardware or software is required; all circuitry necessary for a card to function fully in either orientation is contained within the card itself.

More specifically, in the case of a 16-bit, 5 volt card, card presence and type are detected by the host system by grounding the card detect pins through pull down resistors, both in right side up and inverted orientations, while the voltage sense pins are maintained open.

For 32-bit, 3.3 volt CardBus cards, card presence and card type are detected by the host system before power is applied to the card by shorting together card detect pin CD1 and voltage sense pin VS1 through a circuit external to the ASIC, grounding card detect pin CD2 through a pull down resistor and maintaining voltage sense pin VS2 in an open circuit state.

For 32-bit CardBus cards, card orientation is determined by monitoring the system clock pin and its complementary pin on the 68-pin bus interface. When the signal on one of these two pins has transitioned a predetermined number of times, that pin is thereby identified as carrying the clock signal and is determinative of the card orientation.

Since 16-bit PC Cards do not utilize the host system clock, in accordance with the invention another strategy is employed to determine the orientation of such cards. Generally, in this case, the reset signal and certain command signals appearing on the 68-pin bus interface are monitored to determine whether or not the command signals are stable before and after reset is asserted.

Both 32-bit CardBus PC Cards and 16-bit PC Cards pursuant to the present invention include circuits responsive to the orientation signals generated by the orientation detection state machines for managing power connections (Vcc and Vpp). (Circuit ground pins do not require any special attention because these pins line up in either right side up or inverted orientation of the card.)

BRIEF DESCRIPTION OF THE DRAWINGS

Further objects, features and advantages of the invention will become evident from the detailed description below when read in conjunction with the accompanying drawings in which:

FIG. 2 is a plan view of a standard PCMCIA Type II PC Card;

FIG. 3 is a front elevation view of the card of FIG. 2;

FIG. 4 is a side elevation view of the card of FIG. 2;

FIG. 10 is a rear elevation view of the device of FIG. 8;

FIG. 11 is a side elevation view of the device of FIG. 8;

FIG. 26 is a table listing the pin assignments of the 68-pin connector of a 16-bit PC Card;

FIG. 27 is a table listing the pin assignments of the 68-pin connector of a 32-bit CardBus PC Card;

DETAILED DESCRIPTION OF THE PREFERRED EMBODIMENTS

It should be noted that terms such as "top", "bottom", "upper", "lower", "vertical", "horizontal", "right side up", "upside down", and the like, are used herein only to facilitate the description of the structure of the PC Cards illustrated; it will be evident that the cards may be used in any orientation.

Although it will be evident to those skilled in the art that the removable I/O device of the present invention has broad utility, being usable with a wide variety of standard connector systems including both communication connector systems (for example, modem and Ethernet LAN) and non-communication connector systems (for example, video, coax, BNC, and so forth), the description of the invention will focus primarily on removable PCMCIA communication cards connectable to RJ-type standard modular connectors as a specific, exemplary context for the invention. By "RJ-type" standard modular connectors is meant RJ-11, RJ-45, and like modular connectors used, for example, for telephone line, modem and LAN operations.

Detailed information regarding the RJ-type or series connectors, including their dimensions, are contained in the U.S. government publication found at Title 47 (Telecommunication), Code of Federal Regulations, Chapter I (Federal Communications Commission), Part 68 (Connection Of Terminal Equipment To The Telephone Network), Subpart F (Connectors), Section 68.500 (Specifications) (rev. Oct. 1, 1998). This publication is accessible at http://www.access.gpo.gov/nara/cfr/waisidx_98/47cfr68_98.html and is incorporated herein by reference in its entirety.

Figure 1:
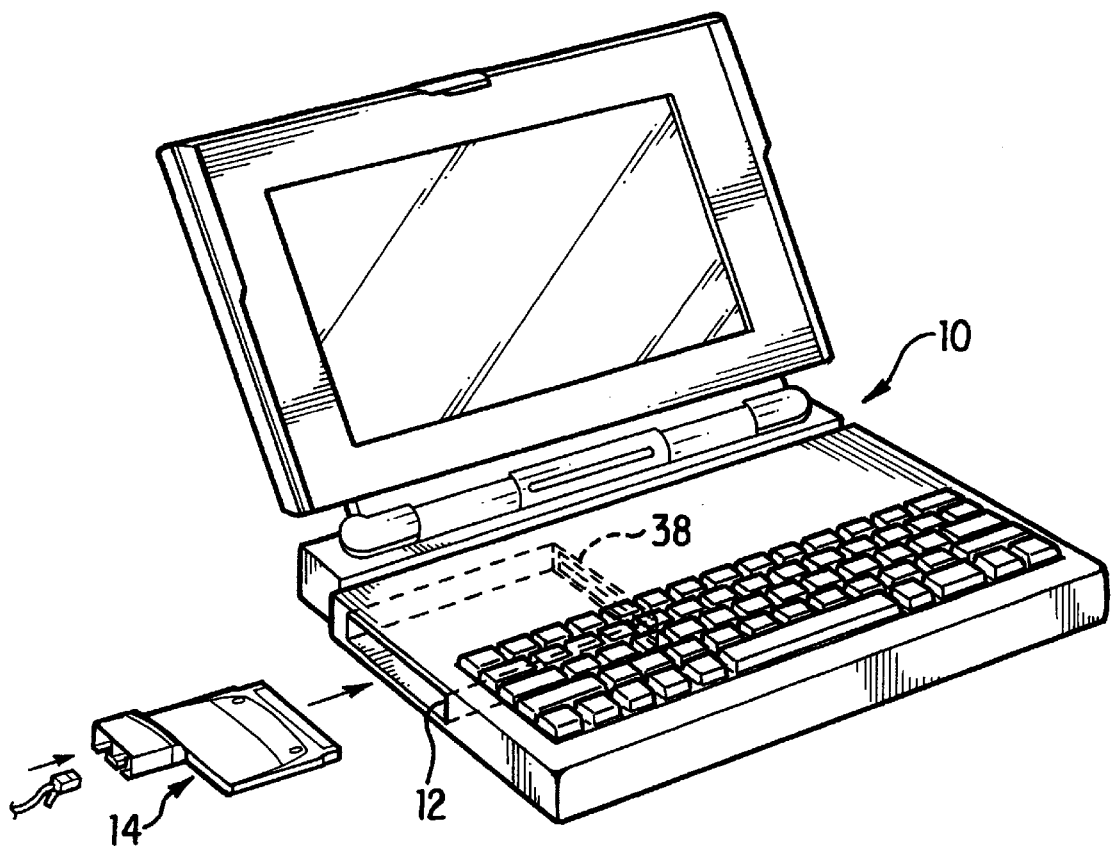
FIG. 1 is a perspective view of a host system in the form of a notebook computer having a dual card slot conforming to PCMCIA interface standards, the slot being adapted to receive communication devices in accordance with the present invention.

FIG. 1 shows a host system which, in accordance with one example, can be in the form of a notebook computer 10. One side of the notebook computer 10 defines a PCMCIA standard slot 12 for receiving and interfacing with interchangeable communication devices such as a device 14 conforming to PCMCIA interface standards and incorporating the teachings of the present invention. As will be explained below, the communication device 14 might combine, for example, the functions of an Ethernet LAN adapter and a telephone line modem.

FIGS. 2–4 show schematically top, front and side views of a conventional Type II PC Card 20. The card 20 includes top and bottom surfaces 22, 24 and parallel, longitudinally extending side rails 26, 28. The card 20 further includes a front margin 30 serving as an interconnect area. Disposed along the front margin 30 of the card is a 68-contact card connector 32 adapted to mate with a 68-pin host connector inside the host system slot. By way of reference, ground contact positions 1, 34, 35 and 68 occupying the four corner positions of the contact array of the connector 32 are identified in FIG. 3.

Figure 5:
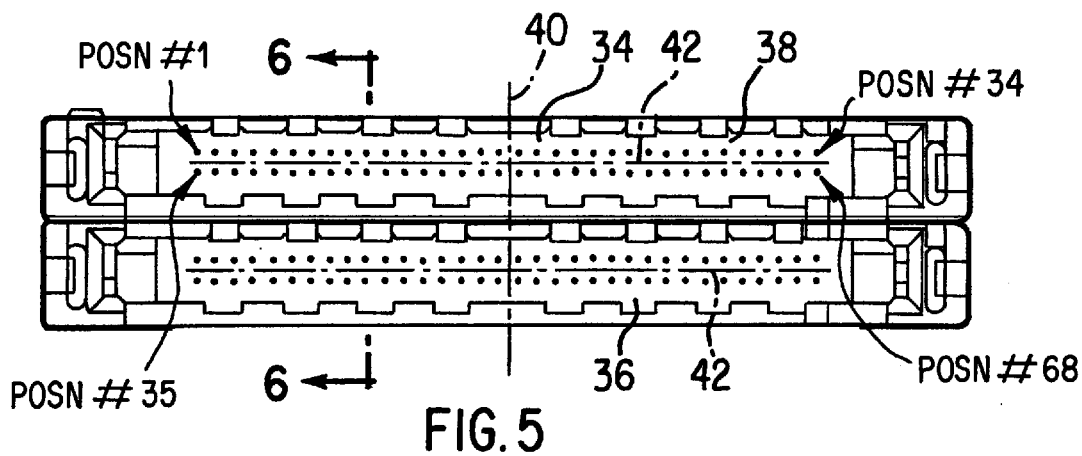
FIG. 5 is a front elevation view of a pair of stacked 68-pin host connectors contained within the PCMCIA slot of the host system shown in FIG. 1, each host connector being mateable with a corresponding connector on a PC Card.
Figure 6:
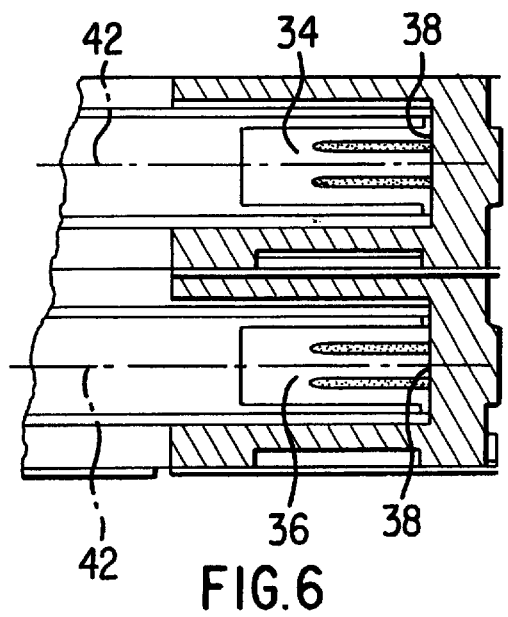
FIG. 6 is a side elevation view, in section, of the host connectors of FIG. 5, as seen along the line 6—6 in FIG. 5.

FIGS. 5 and 6 are front and side elevation views of a typical stacked pair of 68-pin host connectors 34, 36 mounted on the rear wall 38 of the PC Card slot 12 in the host system 10. The four ground pin positions 1, 34, 35 and 68 of the upper host connector 34 are identified. It will be seen that the 68-pin array of each host connector 34 and 36 (like the 68-contact array of the card connector) comprises dual rows of 34 pins each, the 68-pin array being physically symmetrical about vertical and horizontal center lines 40, 42. Electrically, however, the pin assignments for the standard PC Card interfaces are not symmetrical. Accordingly, to assure proper interfacing between the conventional card 20 and the host system 10, the card 20 and host connectors 34, 36 are physically keyed so that the card 20 can only be fully inserted "right side up," that is, with the top surface 22 facing up. Thus, the front end of the longitudinal side rail 26 of the card has a slot 44, symmetrical with the horizontal center line 42, for receiving a corresponding projection on the host connector. Further, the front end of the rail 28 has a notch 46 for receiving a correspondingly dimensioned projection in the host connector. There are two PCMCIA standard notch heights: one for 5-volt cards, shown in FIGS. 2–4, the other (a shallower notch) for 3.3 volt cards. In this way, a 3.3 volt card is blocked from being plugged into a 5 volt slot.

Figure 7:
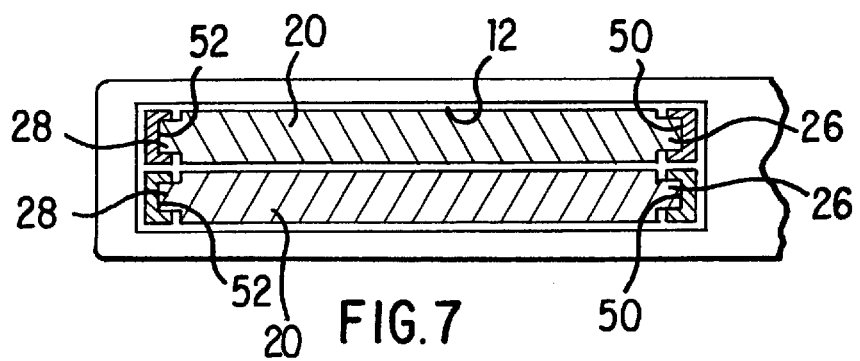
FIG. 7 is a simplified transverse cross-section view showing the PCMCIA card slot in the host system with a pair of communication devices inserted therein.
Figure 8:
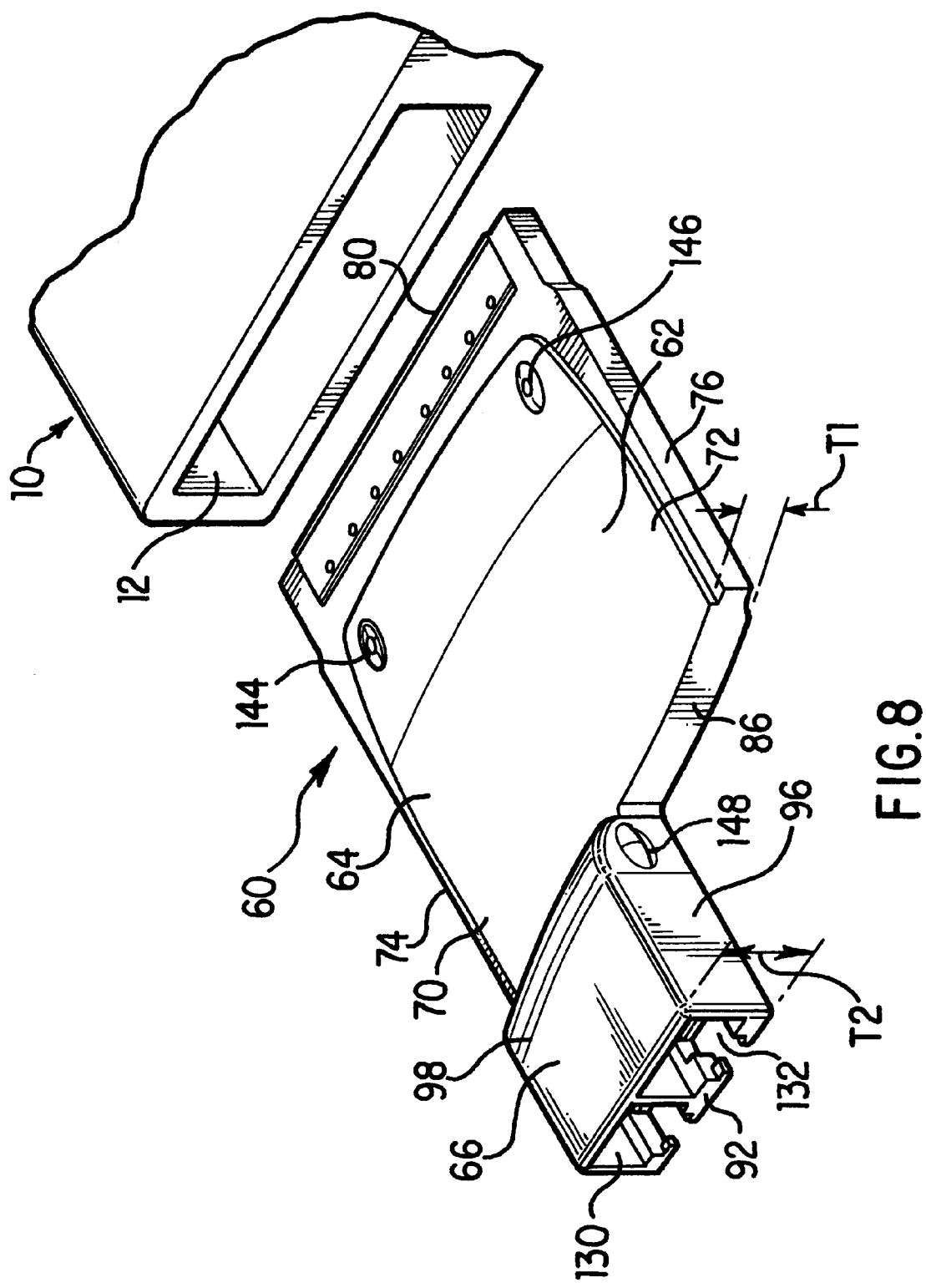
FIG. 8 is a simplified, perspective view of a communication device in accordance with a first embodiment of the present invention.

FIG. 7 is a cross section view showing how the longitudinal side rails 26, 28 of a stacked pair of conventional Type II cards 20 are received by channels 50, 52, respectively, in the host system slot 12.

With reference now to FIGS. 8–12, there is shown a communication device 60 in accordance with a first embodiment of the present invention. The communication device 60 includes a housing 62 having a first, front portion 64 and a second, rear portion 66. The first portion 64 of the housing has a longitudinal center line 68 and parallel, longitudinally extending side margins 70 and 72 disposed equidistant from the center line 68. The longitudinal side margins 70 and 72 of the first portion of the housing further include laterally projecting rails 74 and 76 for engaging the side channels within the PC Card slot 12, in the manner illustrated in FIG. 7. The first portion 64 of the housing 62 has a thickness T1 conforming substantially to the Type II PC Card thickness standard, which, as already noted, is 5.0 mm. The first portion 64 of the housing further includes a transverse front end 78 carrying a standard 68-contact connector 80 adapted to mate with one or the other of the 68-pin connectors inside the slot 12 in the host system 10. The first portion 64 of the housing further includes parallel top and bottom surfaces 82 and 84. The first portion 64 of the housing 62 also includes a generally transverse rear extremity 86.

The second portion 66 of the housing 62, which will also be referred to as the receptacle portion, is attached to and extends from the transverse rear extremity 86 of the first portion. The second portion of the housing includes a top surface 88, a bottom surface 90 parallel with the top surface, and a transverse rear end 92. In accordance with one exemplary embodiment, the bottom surface 90 of the second portion 66 of the housing comprises simply an extension of the bottom surface 84 of the first portion 64 of the housing. The second portion of the housing has a height, T2, conforming substantially to the Type III PC Card thickness standard, namely, 10.5 mm. The second portion 66 of the housing 62 has a longitudinally extending side rail 94 that is an extension of the longitudinal side rail 74 on the first portion 64 of the housing 62.

It will be seen that the second portion 66 of the housing 62 has a width of about one-half that of the first portion 64 of the housing 62 and that the second portion of the housing is disposed to one side of the longitudinal center line 68 so that the card 60 in plan view has a generally L-shaped configuration. In accordance with this embodiment, the second portion of the housing has a rearwardly extending vertical wall 96 coincident with a vertical plane including the longitudinal center line 68. It will be evident as the description proceeds that the second portion 66 of the housing 62 may be somewhat narrower than that shown specifically in the drawings but that in accordance with the most preferred embodiment, the second portion of the housing has a width that does not extend beyond, that is, to the right of, the longitudinal center line 68, as seen in FIG. 9.

The housing portions 64 and 66 may be molded in accordance with well known techniques of Lexan® or similar high impact strength plastic. The housing portions 64 and 66 may be separately molded and then permanently bonded along a joinder line 98 by an adhesive or by sonic welding. The separate molding of the first and second portions 64, 66 and of the housing 62 facilitates manufacture but it will be evident that as an alternative, the housing portions 64 and 66 may be co-molded, that is, molded as one piece to form a unitary housing.

Figure 9:
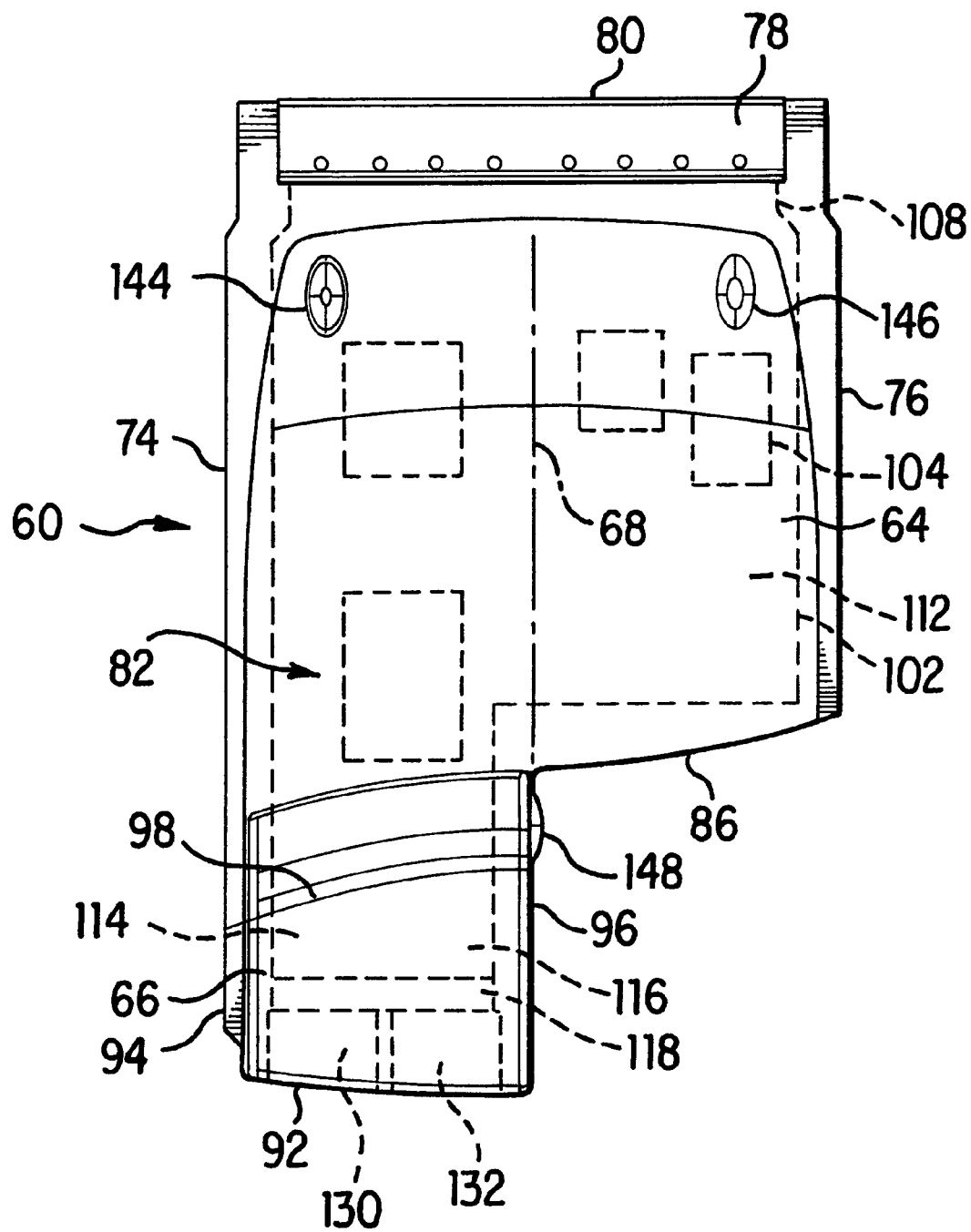
FIG. 9 is a top plan view of the communication device of FIG. 8.

As shown in FIGS. 9 and 11, the first and second portions of the housing 62 further define an internal cavity 100. Disposed within the cavity 100 of the housing 62 is a substrate in the form of a printed circuit board assembly (PCBA) 102 having top and bottom surfaces carrying integrated circuits and other electronic components 104. The 68-contact connector 80 is mounted along a forward margin 108 of the substrate 102, the rearwardly extending leads 110 from the connector being soldered to a terminal section along the forward margin of the PCBA 102. In plan view, the PCBA 102 is generally L-shaped with a larger, front portion 112 being adapted to be enclosed within the first portion 64 of the housing 62 and a rearwardly extending, narrower portion 114 being adapted to be contained within the second portion 66 of the housing. Mounted on a rear margin 116 of the PCBA 102 is a contact block 118 carrying contact wires 120 adapted to be engaged by the contacts on standard RJ-type modular plugs. Such contact blocks are described and shown in detail in the above-identified incorporated U.S. patent and patent applications.

The cavity 100 defined by the first and second portions of the housing 62 is enclosed by a generally L-shaped bottom sheet metal cover panel 126 having longitudinal sides 128 with upstanding lock tabs for engaging associated surfaces along the longitudinal sides of the first and second portions of the housing 62. Such cover panels and the manner in which they are attached to housing elements are well known in the art and therefore are not described in detail. The width of the communication device 60 shown in FIGS. 8–11 conforms substantially to the PC Card width standard of about 54.0 mm. Likewise, the overall length of the communication device 60, that is, the length extending from the transverse front end 78 of the first portion 64 of the housing to the transverse rear end 92 of the second portion 66 of the housing conforms substantially to the PC Card standard of about 85.6 mm. In accordance with a specific, exemplary embodiment of the invention, the first portion 64 of the housing 62 may have a length extending from the transverse front end 78 to the transverse rear end 86 thereof of approximately 55.8 mm. In accordance with this example, the length of the second portion 66 of the housing will be about 29.8 mm.

The second portion 66 of the housing 62 includes at least one receptacle adapted to receive a standard communications plug for directly connecting the communication device 60 to an information transfer system. Two receptacles 130 and 132 and are shown in the embodiment under consideration. The receptacle 130 may be designed to receive a standard RJ-11 modular plug for direct connection to a telephone line for data/fax modem transmissions while the receptacle 132 is designed to receive a standard RJ-45 modular plug for direct connection to an Ethernet LAN. Structural details of the receptacles 130, 132 may be found in the incorporated U.S. patents and co-pending U.S. patent application referenced above.

The housing of the communication device encloses a substrate or printed circuit board carrying circuit elements for interfacing the digital host system with the information transfer system. Such circuitry is well known in the art and will therefore not be described in detail. Suffice it to say that the substrate may be carried completely within the first portion of the housing or, if necessary, can include a portion projecting into the second portion of the housing. The receptacles and in the second portion of the housing include a plurality of electrical contacts and adapted to be engaged by mating contacts on the standard modular plugs adapted to be received by the receptacles. Likewise, the 68-contact receptacle at the front end of the housing is electrically connected to circuit elements on the substrate, also in a manner well known in the art. An example of a modular RJ-type plug is shown schematically in FIG. 1.

Figure 12:
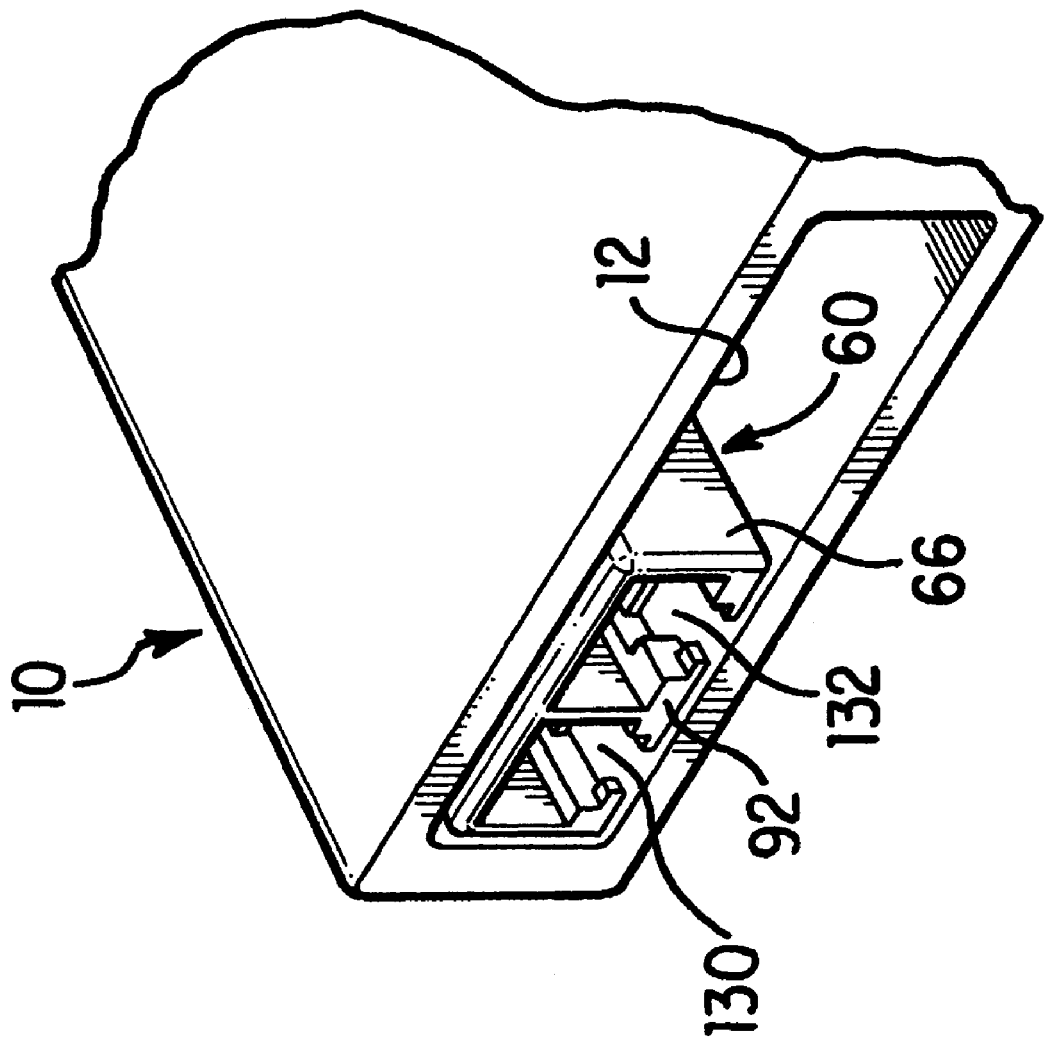
FIG. 12 is a perspective view of a portion of a host system including a PCMCIA slot with a communication device in accordance with the embodiment of FIG. 8 fully inserted therein.
Figure 13:
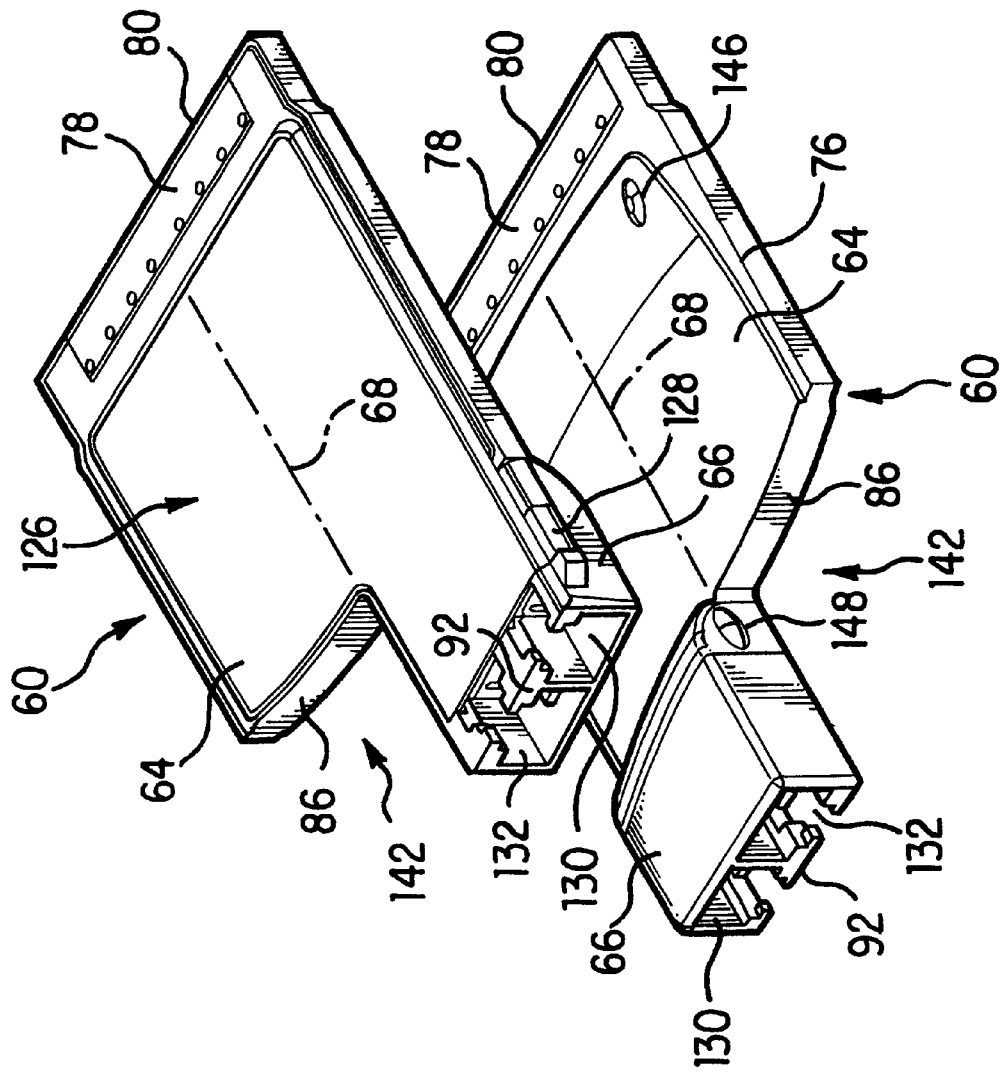
FIG. 13 is a perspective view of two communication devices in accordance with the present invention showing the relative positions of the devices prior to stacking.
Figure 14:
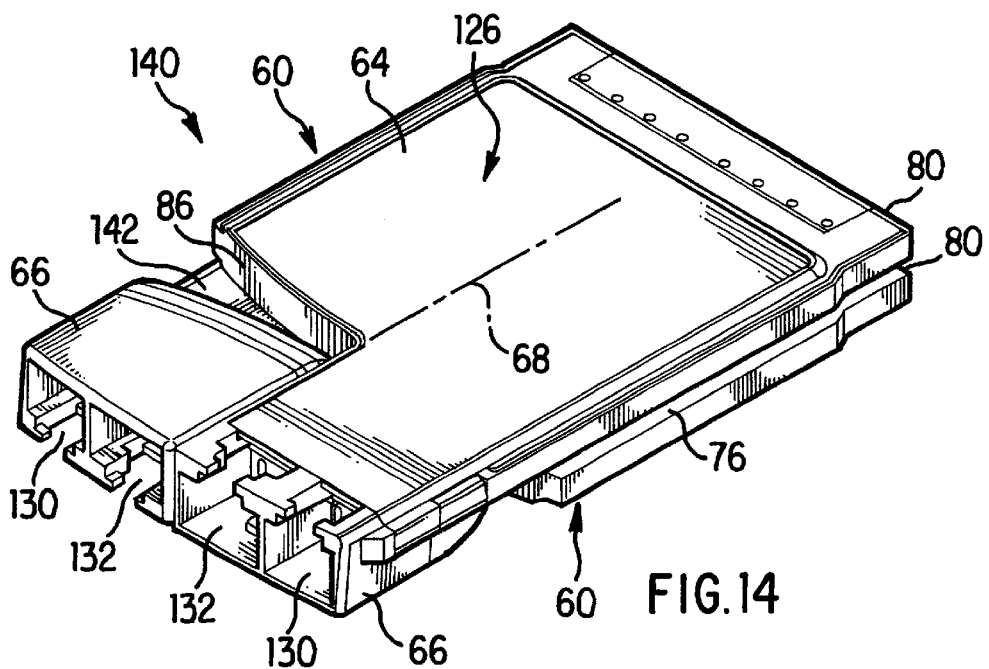
FIG. 14 is a perspective view showing the communication devices of FIG. 13 in the stacked configuration.
Figure 15:
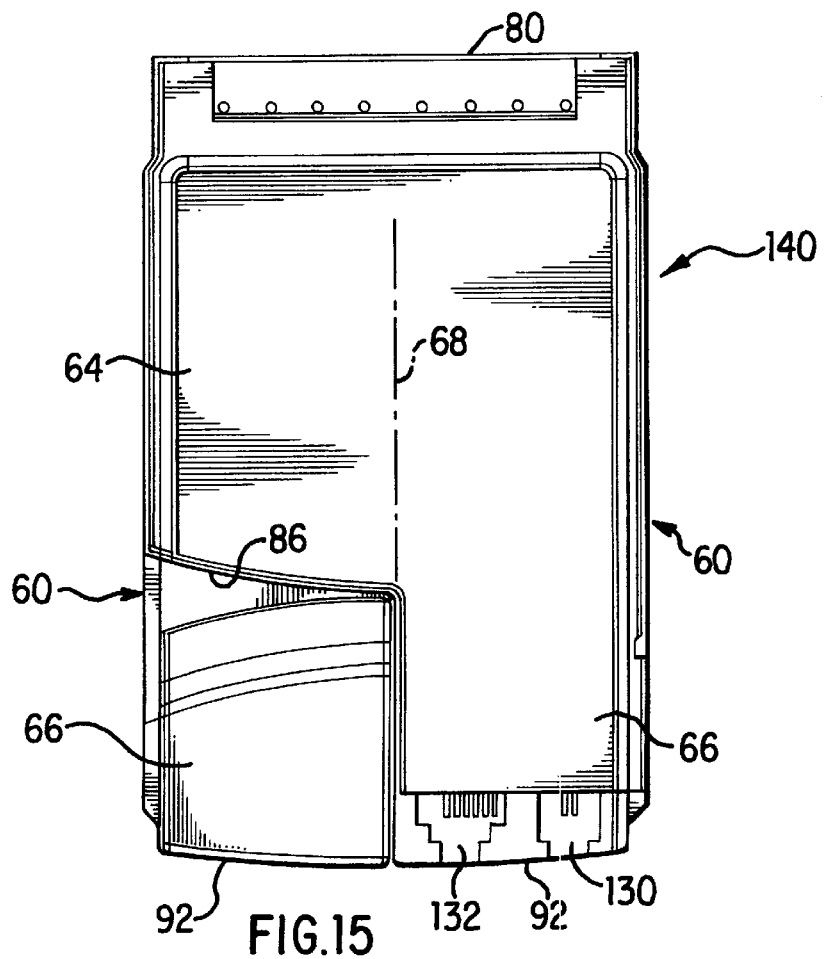
FIG. 15 is a top plan view of the stacked cards of FIG. 14.
Figure 16:
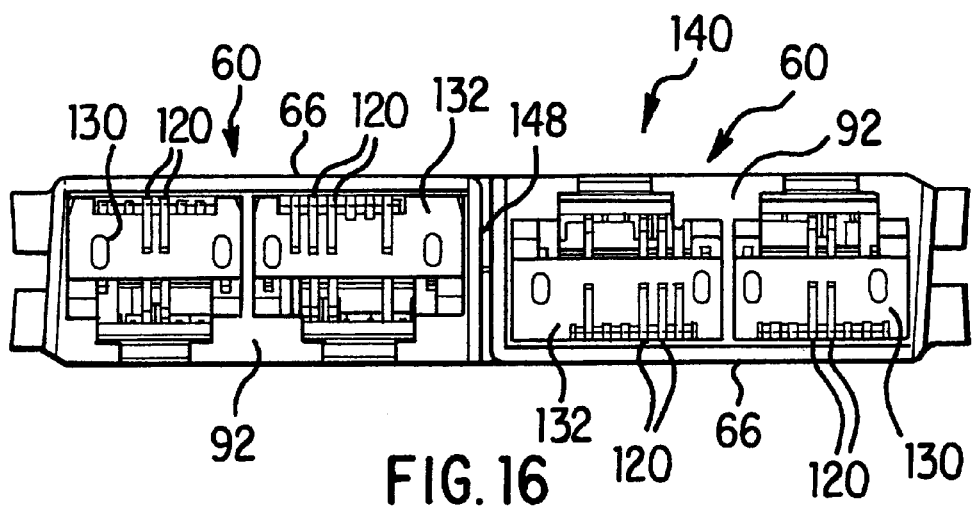
FIG. 16 is a rear elevation view of the stacked cards of FIG. 14.
Figure 17:
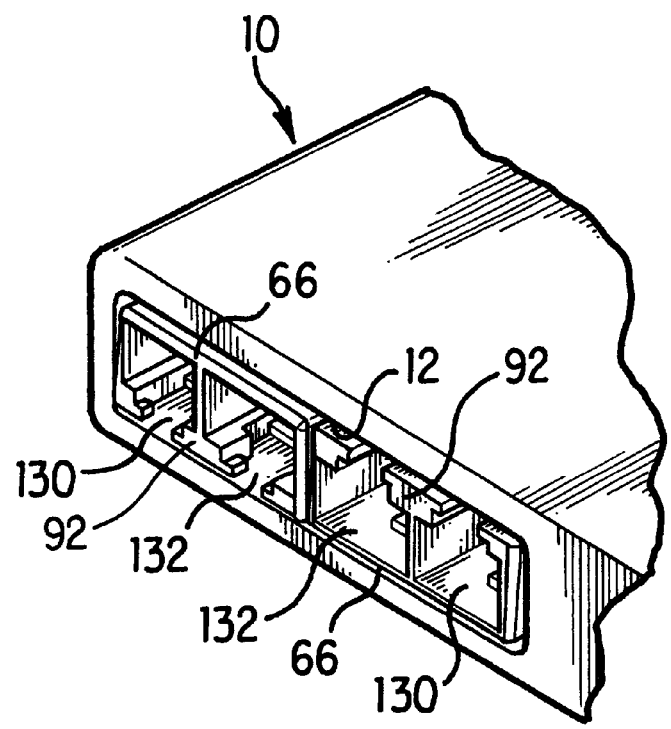
FIG. 17 is a perspective view of a portion of a host system having a PCMCIA slot, showing the stacked communication device of FIG. 14 fully inserted therein.

With reference also to FIGS. 5–7, the communication device 60 of FIGS. 8–12, shown in its "right side up" orientation, that is, with the top surfaces 82, 88 directed upwardly relative to the host system, is insertable into the lower channels 50, 52 of the PC Card slot 12 in the host system so that the 68-contact connector at the front end of the communication device mates with the lower 68-pin connector 36 inside the slot. FIG. 12 shows the device 60 fully inserted in the slot 12 of the host system 10. In accordance with another aspect of the invention, the communication device 60 can be flipped over or inverted so that its bottom surfaces 84, 90 face up and in this orientation can be inserted so as to engage the upper channels 50, 52 within the PC Card slot 12 and the upper 68-pin connector 34 within the slot. In order to accomplish this, the keys 44 and 46 conventionally provided along the front extremities of the longitudinal sides of the communication device are eliminated. The device 60, however, includes circuitry for accommodating either right side up or inverted orientation, as will be explained in greater detail below. It will thus be seen that the communication device 60 can be inserted so as to make use of either the upper or lower 68-pin connector 34 or 36 within the slot 12. Given this capability and the configuration of the device 60, it will now be seen that two communication devices 60—one right side up, the other inverted—can be joined to form a combined communication device 140 that itself can be coupled to the two 68-pin slot connectors in either orientation. In this connection and with reference to FIGS. 13–17, it will be seen that two cards 60 in accordance with the invention can be joined with the second portion 66 of the housing 62 of one device 60 nesting in the space 142 adjacent to the second portion 66 of the housing of the other device 60. Complimentary locating means, such as corresponding, mateable projections and depressions 144, 146 on the top surface 82 of each card 60, as well as mateable projections 148 on the vertical walls 96, can be included to maintain the two cards in their correct positional relationship to facilitate the proper insertion of the juxtaposed cards into the host system slot 12. The overlying Type II first portions 64 together have a combined or overall thickness of a Type III card so that the overall thickness of the resulting assembly is substantially that of a Type III card. As already indicated, this composite communication device or assembly 140 can be fully inserted in the host system slot right side up (FIG. 17) or upside down, and in either orientation the 68-contact front connectors mating with the corresponding stacked connectors within the PC Card slot 12.

Figure 18A:
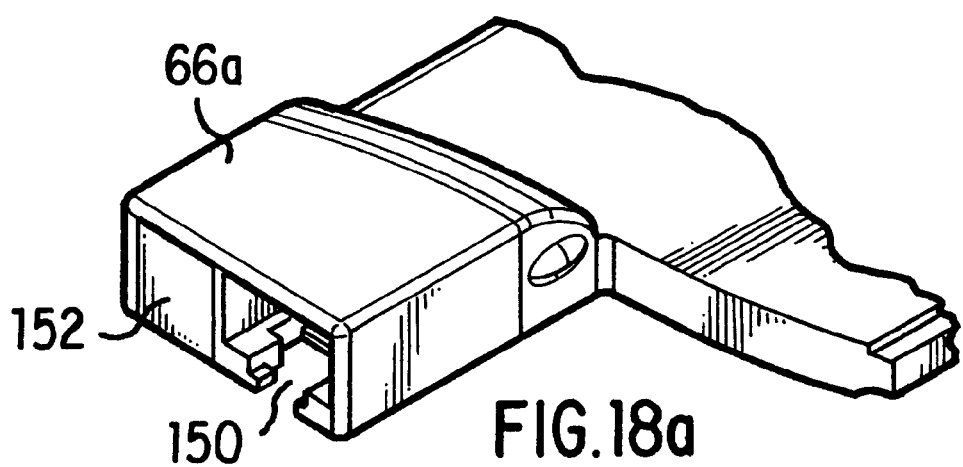
FIGS. 18a–18c show three specific alternative embodiments of the receptacle portion of the communication device of the present invention.
Figure 18B:
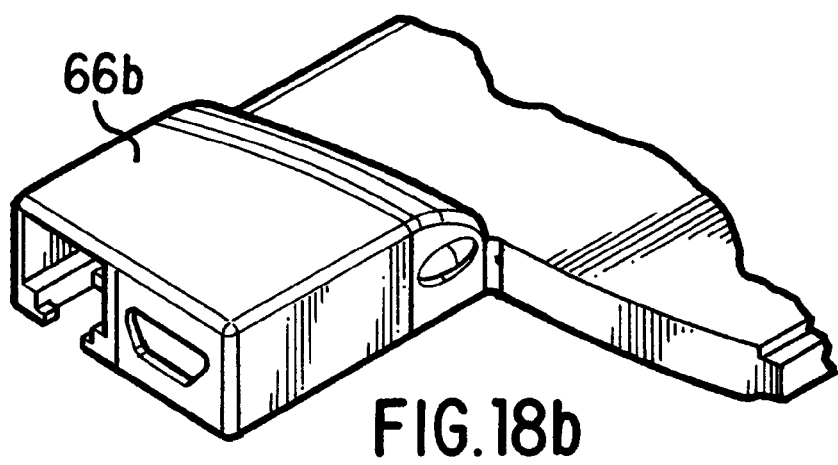
Figure 18C:
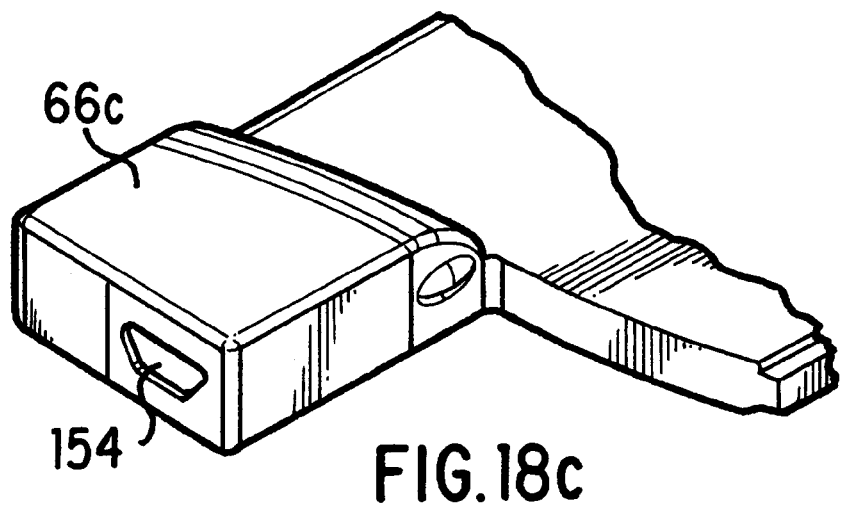

FIGS. 18a–18c show alternative second or rear housing portions 66a–66c adapted to connect a communication device of the present invention to any one or more of a plurality of information transfer systems. FIG. 18a shows an embodiment of a second housing portion having a single active receptacle 150 for receiving an RJ-45 plug for Ethernet LAN communications only. In this case, the position adjacent the RJ-45 receptacle that would normally define a second receptacle is covered with a plastic insert 152. FIG.

18b shows another embodiment of the second portion of the housing permitting the communication device to function both as a modem interface and an accessory (for example, cellular phone) interface. FIG. 18c has an accessory receptacle 154 designed to receive an accessory connector with the other receptacle position covered up. In yet another variation, not shown, the second housing portion has identical receptacles for receiving RJ-11 plugs for modem and pass-through connections. It will thus be seen that the communication devices of the invention can provide a user with a broad range of options either in the form of a single communication device or by stacking two of the communication devices as earlier explained.

Figure 19:
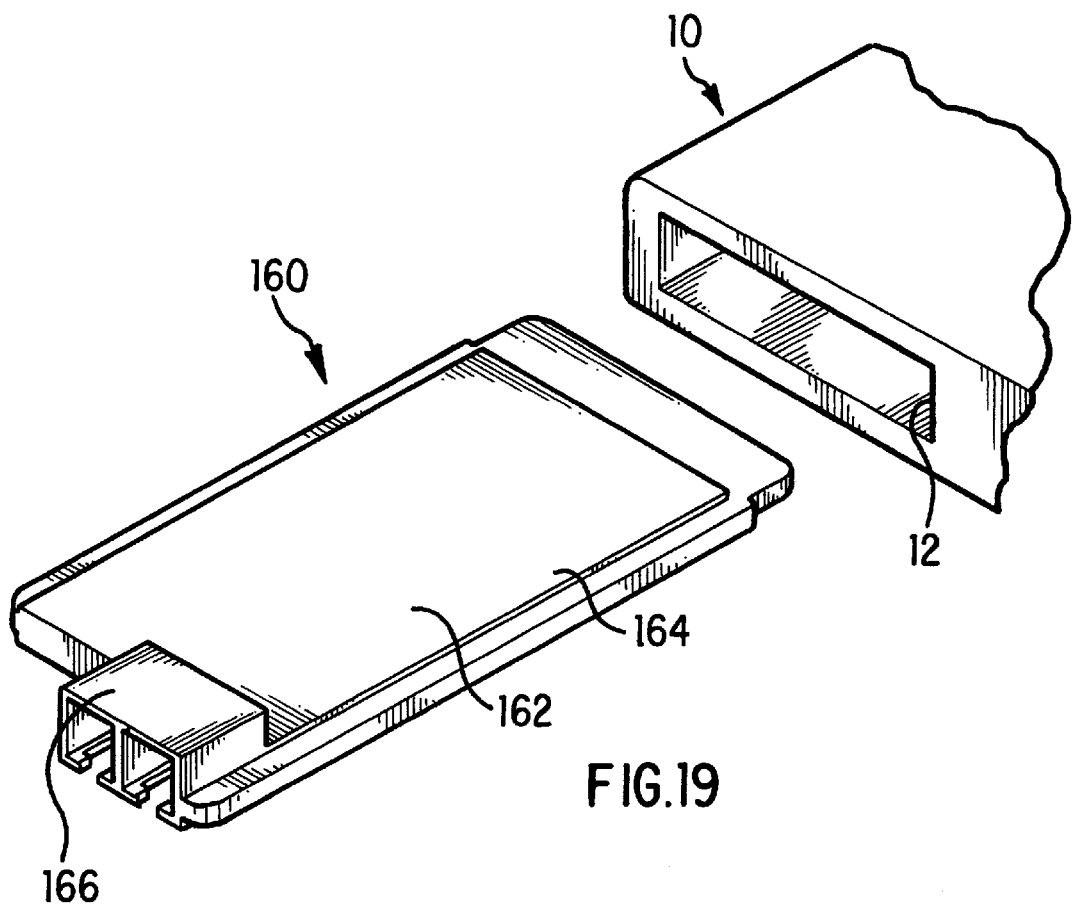
FIG. 19 is a perspective view of yet another embodiment of the present invention comprising an extended length version thereof.
Figure 20:
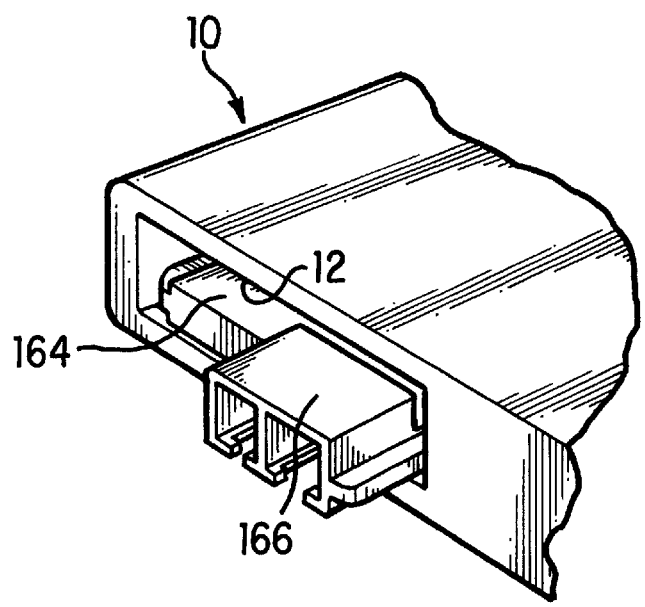
FIG. 20 is a perspective view showing the communications device of FIG. 19 fully inserted in the PCMCIA slot of a host system.

Turning now to FIGS. 19 and 20, there is shown an extended length embodiment of the present invention. FIGS. 19 and 20 show a communication device 160 including a housing 162 having a first or main portion 164 and a second or rear portion 166. The length of the first portion 164 of the housing conforms substantially to the length (85.6 mm) prescribed by the PC Card standard. As shown in FIG. 20, with the extended length communication device 60 fully inserted in the slot 12 of the host system 10, at least a part of the second portion or portion 166 of the housing 162 projects from the side wall of the host system. Because of this projection, this embodiment is less preferred; on the other hand, the extended length of the first portion of the housing permits the incorporation of a substrate or PCBA having a larger usable area.

It will be evident that although it is preferable to orient the receptacles in the second portion of the housing so as to receive the associated plugs in a longitudinal insertion direction, the orientation of the receptacles can be varied so as to receive the mating plugs in a direction that departs from longitudinal to some extent, so long as the upper and lower faces of the plug are maintained substantially parallel with the upper and lower exterior surfaces of the receptacle-defining, second portion of the device.

It further will be obvious that the second portion of the housing may be provided with various connector receptacle combinations besides those illustrated. Further, the second portion of the housing can be adapted to connect the card to any one or more of a plurality of data or information transfer systems, U.S. and/or foreign. Other connectors include, without limitation, mini-DIN, BNC/coax, D-sub, USB (Universal Serial Bus) and IEEE-1394. A particular communications device according to the invention may thus incorporate any one or a combination of standard connectors known in the relevant industries, all within the Type III card form factor and particularly the 10.5 mm height limitation.

Figure 21:
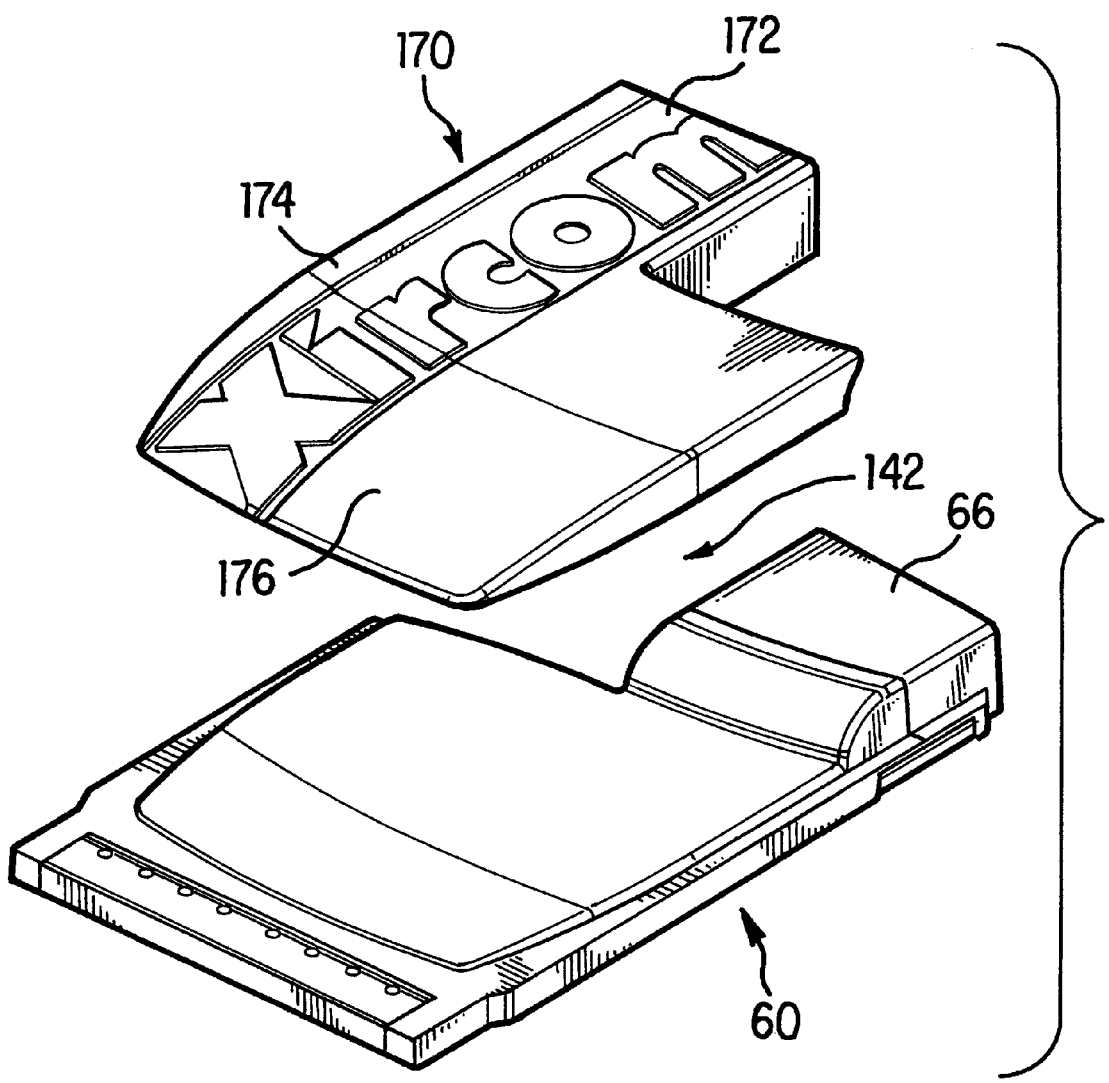
FIG. 21 is an exploded perspective view of another embodiment of the present invention including a filler member for occupying the space that would otherwise be occupied by one of two stacked communication devices.
Figure 22:
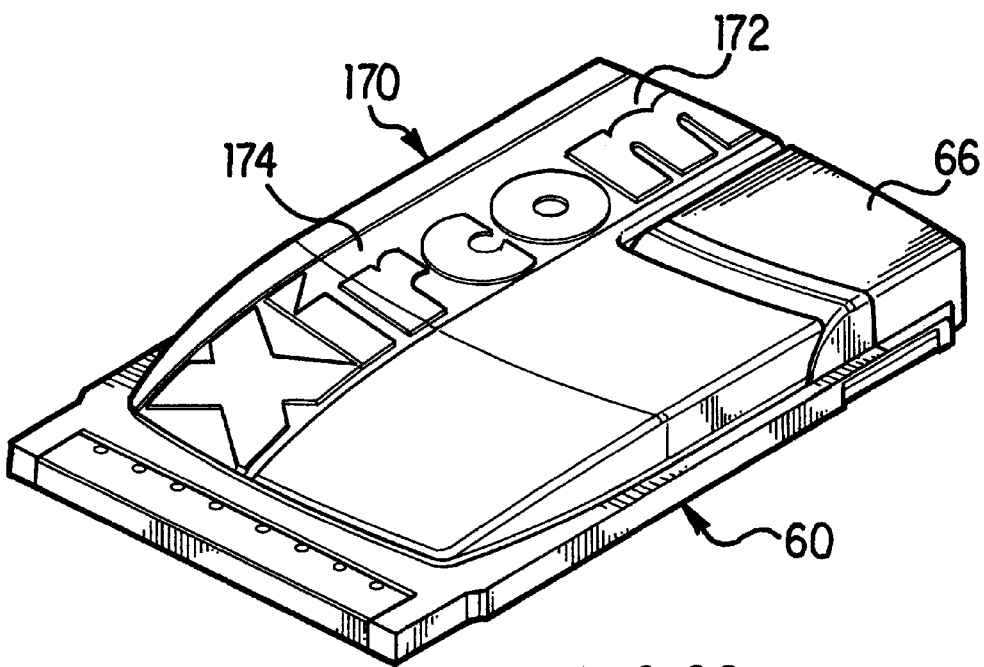
FIG. 22 is a top perspective view of the embodiment of FIG. 21.
Figure 23:
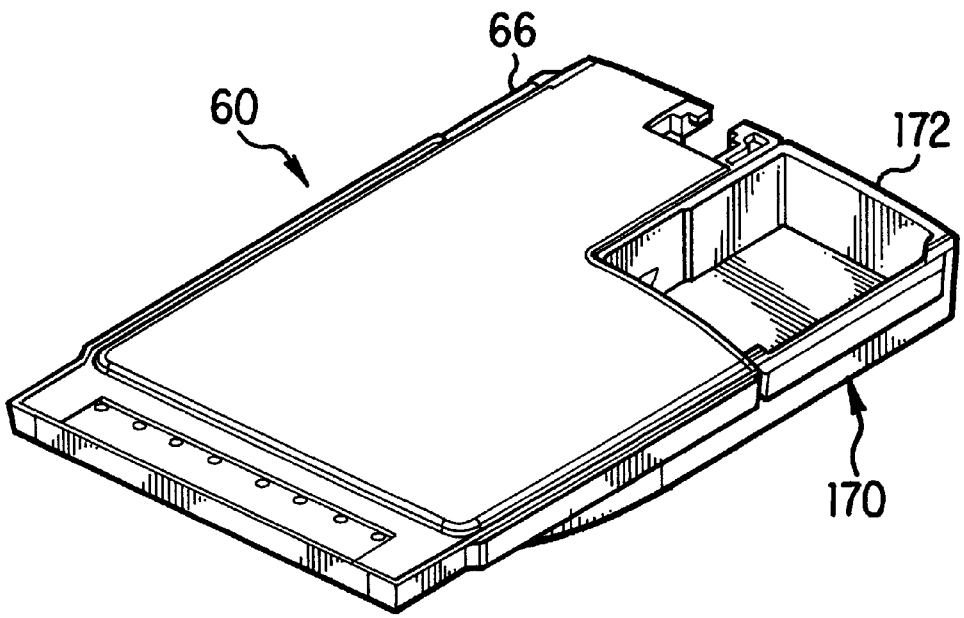
FIG. 23 is a bottom perspective view of the embodiment of FIG. 21.

With reference to FIGS. 21–23, there is shown another embodiment of the invention employing a filler member 170 in conjunction with an invertible communications device or card 60 when such device is used by itself. The filler member 170 has an L-shape complementary to that of the card 60 and may be fabricated inexpensively as a one-piece molded, shell-like plastic unit. The filler member 170 includes a rear portion 172 having a thickness conforming to the Type III PC Card standard. The rear portion 172 of the filler member is configured to occupy the space 142 adjacent the rear portion 66 of the card 60; the forward portion 174 includes a gently curved upper surface 176.

Figure 24:
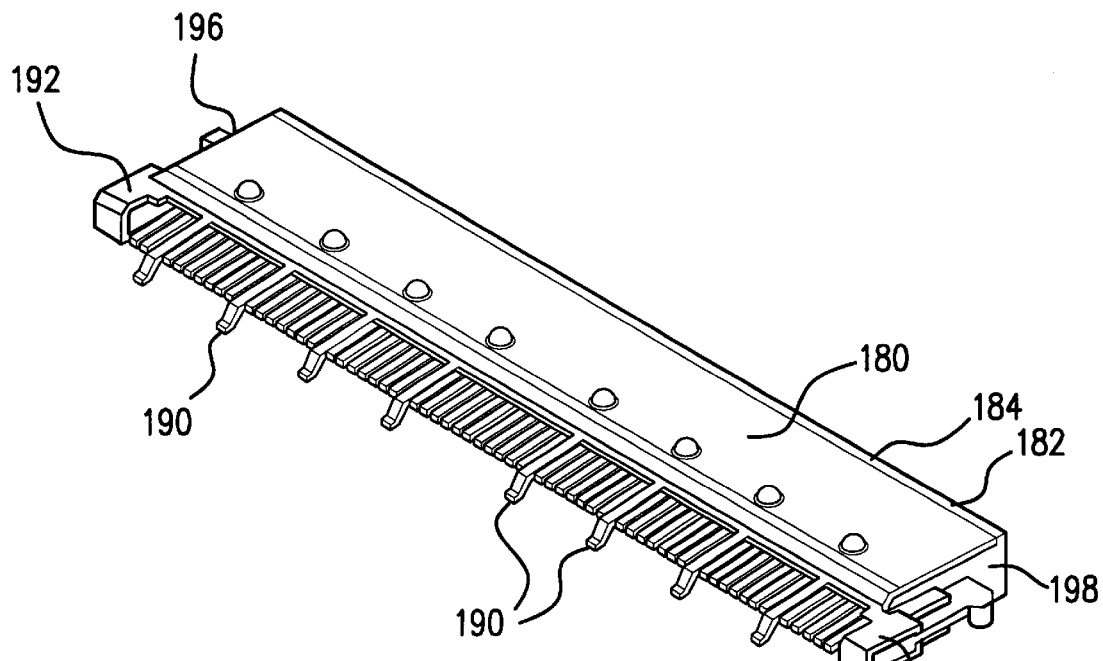
FIG. 24 is a top perspective view of a 68-contact CardBus connector carrying top and bottom ground plates.
Figure 25:
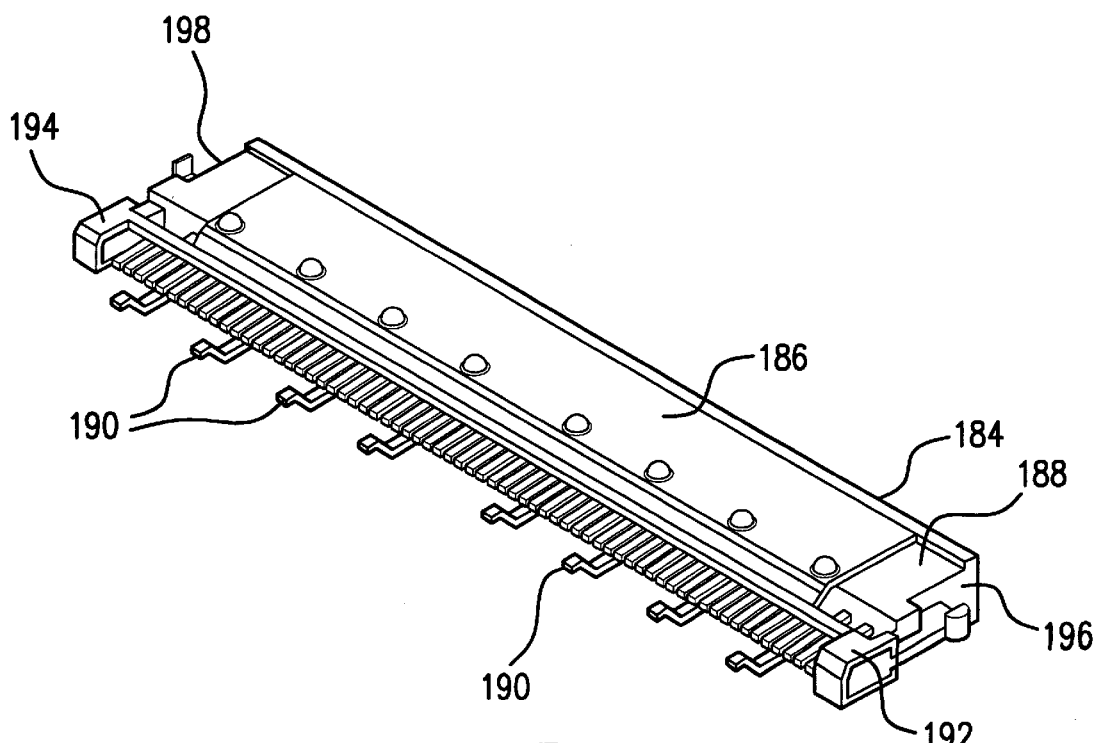
FIG. 25 is a bottom perspective view of the CardBus connector shown in FIG. 24.

A communication device according to the present invention may conform to the 32-bit CardBus standard and include, in accordance with that standard, a ground plate on the top surface of the 68-contact front connector. An example of such a ground plate structure is disclosed in U.S. Pat. No. 5,940,275 issued Aug. 17, 1999, which patent is incorporated herein by reference. As is known, the CardBus ground plate makes contact with ground terminals inside the slot in the host system when the card is fully inserted in the slot. As explained, a PC Card in accordance with the principles of the present invention may be inserted in the host system slot right side up or upside down. Thus, in accordance with another aspect of the present invention shown in FIGS. 24 and 25, a CardBus PC Card is provided which includes not only a top ground plate 180 on the top surface 182 of the 68-contact front connector 184, but also a ground plate 186 on the bottom surface 188 of the connector. The top ground plate 180 includes solder tails 190 for connection to ground traces on the PCBA. Such solder tails may be omitted from the bottom ground plate 186. Instead, the bottom ground plate 186 is mechanically and electrically connected to the top ground plate 180 by means of conductive U-shaped straps 192 and 194 adjacent the ends 196 and 198 of the front connector. Accordingly, when the card is inserted upside down in the host system slot, the bottom ground plate 186 is engaged by the ground terminals inside the slot, a ground path to the PCBA ground traces being thereby established through the end straps 192 and 194 and top ground plate 180.

In connection with yet another aspect of the present invention, the following is a description of the electronics for accommodating right side up and inverted orientations of 16-bit and 32-bit CardBus PC Cards.

A. Electronics Overview

As already explained, a PC Card host slot uses a 68 pin connector system. If a card is flipped over or inverted and inserted into the host system PC card slot, contact position 01 on the card connector that would have been connected to pin 01 of the host connector is now connected to host pin 68. Likewise, card connector contact position 02 that would have been connected to host pin 02 is now connected to host pin 67, and so forth. Thus, in the general case, for an inverted card, the contact position (n) which would have been connected to pin (n) of the host system in the right side up orientation of the card, is instead connected to complementary pin (69-n). FIGS. 26 and 27 contain complete listings of the standard PC Card pin assignments for 16-bit PC Cards and 32-bit CardBus Cards, respectively; the listings are by pin numbers 01–68. The directions listed indicate whether a particular signal is bidirectional (B), output only (O), tri-stateable output (T), or input only (I).

Because of the asymmetry of the electrical signals appearing on the various pins of a 68 position PC Card connector, if conventional PC Cards are plugged in incorrectly they will not function properly and damage to the card could result. With the ability to connect PC Cards to host systems either right side up or inverted, the present invention safeguards against damage, and allows full functionality of an inverted card. This ability also allows creation of new products, such as those already described, that mate together to fit in both PC Card channels of a host system, without limiting the cards to a single orientation.

The ability to plug in a PC Card in both right side up and inverted orientations presents several issues: card presence and type detection; card orientation detection; power connections and management; and signal multiplexing. These issues are addressed by the card circuits shown in FIGS. 28–40. Basically, such circuits comprise an application specific integrated circuit (ASIC) and related circuitry external to the ASIC that allow the device to be inserted in the host slot and to function fully in either orientation. The ASIC and related circuitry are different depending on the type of PC Card.

When a conventional PC Card is plugged into a host system, slot, the host system uses a scheme for determining that a card is inserted, and what type of card it is, before it can power the slot. The conventional scheme involves the host system driving and monitoring a set of four signals on the 68 pin connector: card detect signals CD1 (pin 36) and CD2 (pin 67), and voltage sense signals VS1 (pin 43) and VS2 (pin 57). Since these signals must be connected to the ASIC, the ASIC must have special buffers that are in a high impedance state before power can be applied to the chip, that is, during the interval that the host system senses the presence of a card and determines its type. For a host system to properly detect an invertible 16-bit, 5V PC Card, CD1 and CD2 should be grounded, and VS1 and VS2 should be open. For an invertible 3.3V CardBus PC Card, CD1 and VS1 should be shorted together, CD2 should be grounded, and VS2 should be open in order to detect the proper card insertion.

After card presence and type detection, card orientation (right side up or inverted) must be determined in order to drive or monitor the appropriate signals on the 68 pin connector. In accordance with the invention, the ASIC includes an orientation detection state machine which, utilizing bus signals unique to each type of card (16-bit or 32-bit), generates control signals indicative of whether the card is right side up or inverted.

With respect to the power and ground connections, the ground pins line up properly when the card is flipped over, but the card Vcc power connections (on pins 17 and 51) line up with Vpp connections (on pins 18 and 52). The Vpp signals may supply programming voltages from the host, and it is not desirable to have these connected to the PC Card Vcc power supply. Accordingly, a special circuit, external of the ASIC and responsive to the orientation control signals provided by the orientation detection state machines, disconnects the Vpp source. Last, a signal multiplexer connected to the card function circuits multiplexes the various complementary unidirectional, bidirectional and tristateable signals to and from the bus interface in response to the orientation control signals.

B. Invertible 16-bit, 5 Volt PC Cards

Figure 28:
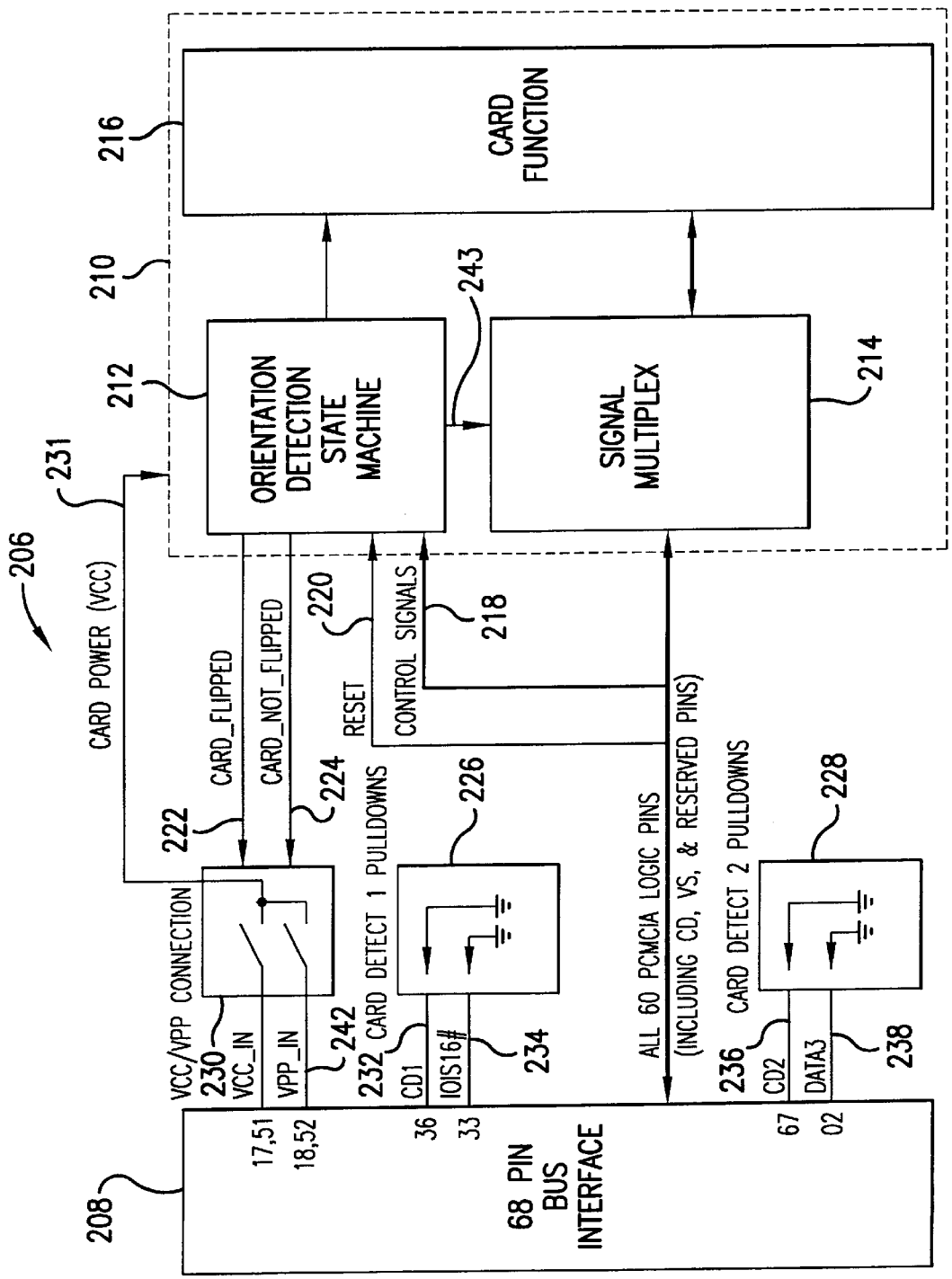
FIG. 28 is a functional block diagram of the circuitry incorporated in an invertible 16-bit PC Card in accordance with the invention.

With reference to FIG. 28, there is shown a functional block diagram of a system allowing a 16-bit PC Card 206 having a 68 contact I/O bus interface connector 208 (also called a 68-pin card connector herein) to be plugged into the PCMCIA slot of a host system in either right side up or inverted orientation. The system of FIG. 28 includes an ASIC 210 incorporating an orientation detection state machine 212, a signal multiplexer 214, and conventional card function circuits 216 including controller, interface and other adapter circuitry enabling the host system to be connected to information transfer systems such as Ethernet LANs and public switched telephone networks by means of standard modular RJ-45 and RJ-11 connectors. Certain command signals shown collectively as appearing on a line 218 and the card reset signal shown on line 220 are used by the orientation detection state machine 212 to determine card orientation and generate "Card_Flipped" and "Card_Not_Flipped" control signals 222 and 224.

The system of FIG. 28 further includes circuitry, external of the ASIC 210, including card presence and type detection circuits 226 and 228, and a power connection circuit 230 for providing the correct supply voltage (Vcc) to the card on the line 231 irrespective of card orientation. The card detection circuit 226 is connected to card detect CD1 (pin 36) and its (69-n) complement, IOIS16# (pin 33) on the 68-pin card connector 208, via lines 232 and 234, respectively. Card detection circuit 228 is connected to card detect CD2 (pin 67) and its (69-n) complement, Data03 (pin 02), via lines 236 and 238 in FIG. 28. The power connection circuit 230 is connected to (a) both power supplies Vcc1 and Vcc2 (pins 17 and 51) via line 240, and to (b) both power supplies Vpp1 and Vpp2 (pins 18 and 52) via line 242.

The control signals 222 and 224 generated by the orientation detection state machine 212 control both the power connection circuit 230 and the signal mutiplexer 214 (via the line 243).

Figure 29A:
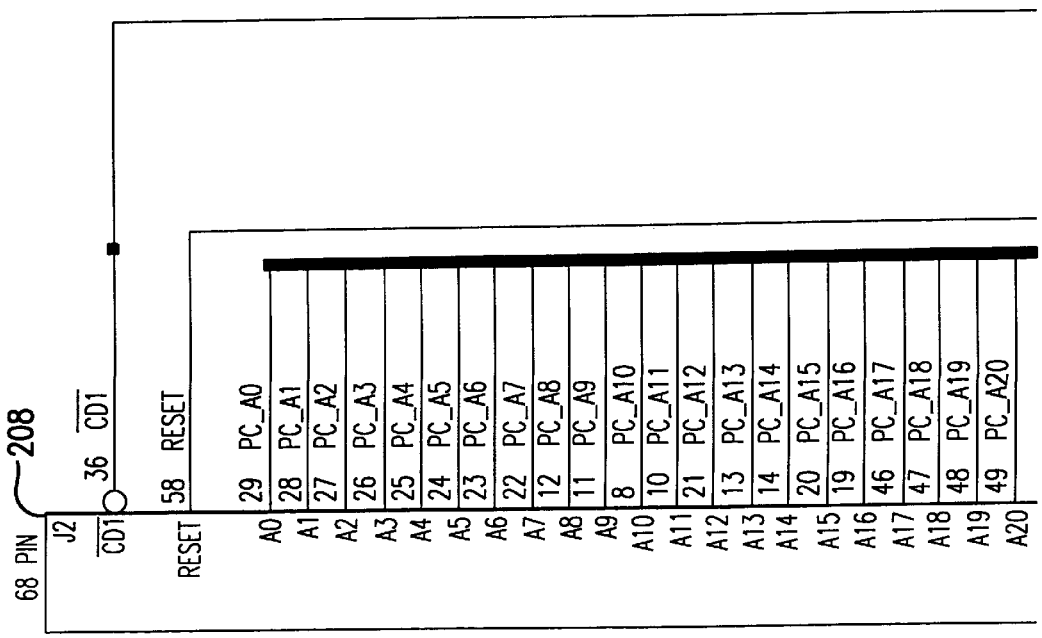
FIG. 29 is a top level schematic of the connections between the 68-contact connector and the ASIC in an invertible 16-bit PC Card in accordance with the invention.
Figure 29B:
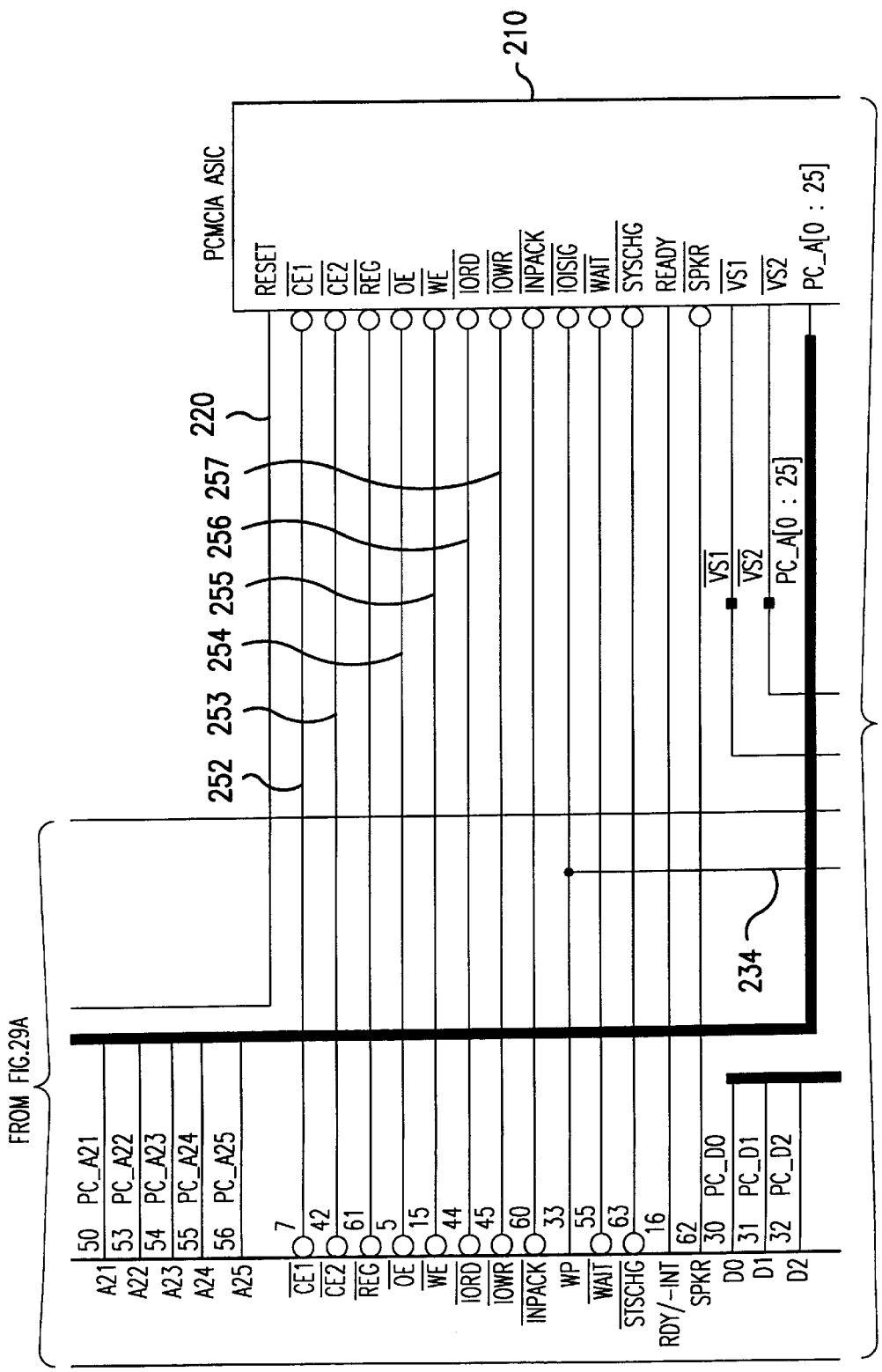
Figure 29C:
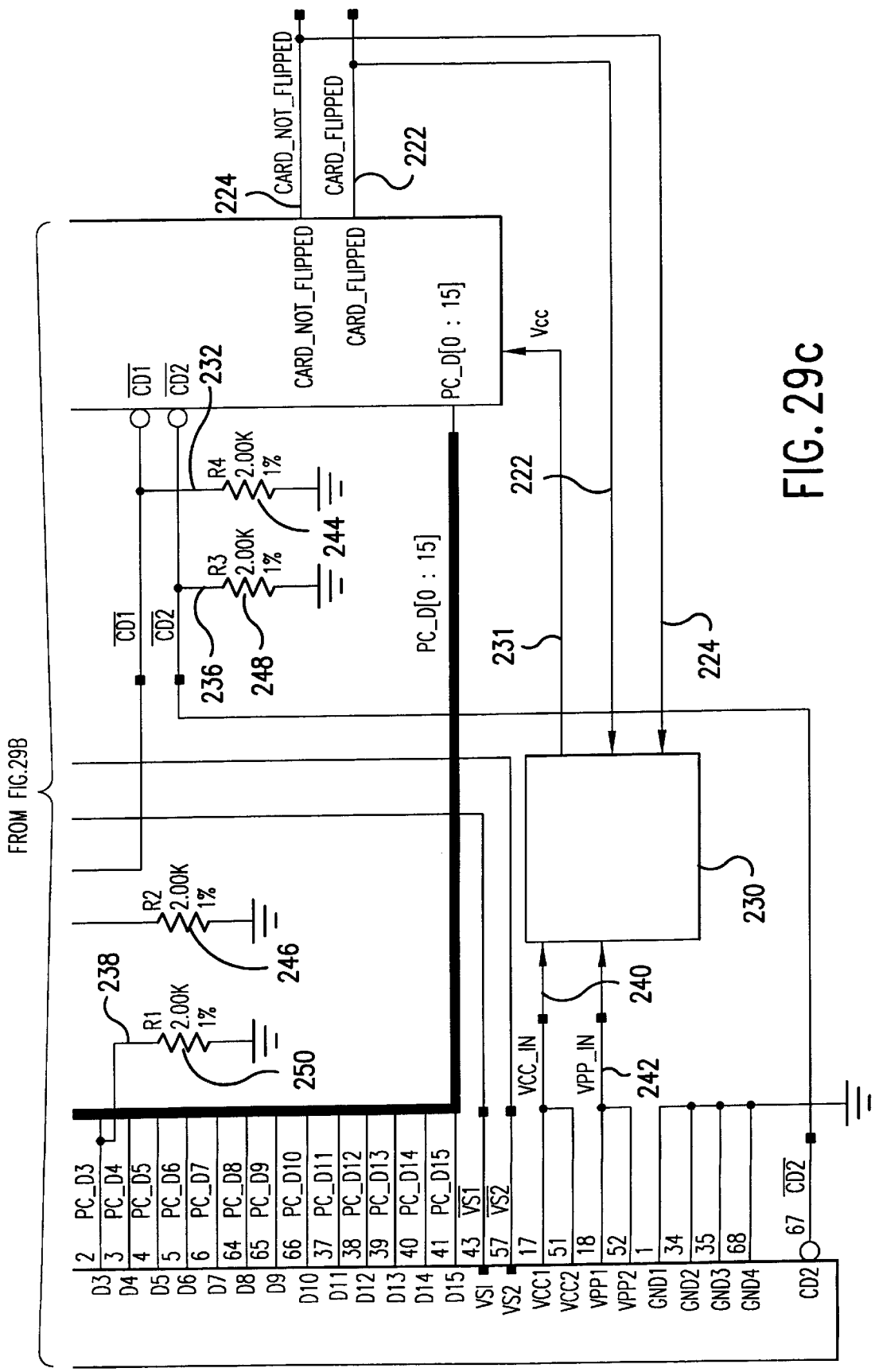

Turning now to FIG. 29, there is shown in greater detail the connections between the 68-pin connector 208 and the ASIC 210, which connections are for the most part self explanatory. As already indicated, for invertible 16-bit, 5V PC Cards, CD1 and CD2 should be grounded, and VS1 and VS2 should be open for proper card detection. This is accomplished by having pulldown resistors on CD1 and CD2 and their complements IOIS16# and Data03, for both orientations. Thus, the card detection circuit 226 comprises a first pulldown resistor 244 connecting CD1 to ground and a second pulldown resistor 246 connecting IOIS 16# to ground. Similarly, the card detecting circuit 228 comprises first pulldown resistor 248 connected between CD2 and ground, and a second pulldown resistor 250 connecting Data03 to ground.

With respect to orientation detection of invertible 16-bit cards, a certain set of command signals driven by the host system for controlling PC Card cycles is used. When the card is flipped over, several of these command signals as well as the reset signal are now connected to address pins. While the behavior of the address pins is indeterminate, the behaviors of the reset signal and command lines are defined by the 16-bit PC Card specification. After reset is deasserted, the command lines must be static and in the inactive state. The behavior of these command signals is used by the orientation detection state machine 212 to determine card orientation. On chip power-up, the functional circuitry of the chip is held in reset and the output control signals are held in an inactive state. Meanwhile, the orientation circuitry 212 monitors the input reset and command signal pins for both the normal and reverse orientations. When the behavior of a set of the signals match the reset and command lines, the card orientation is established.

The invertible 16-bit PC Card embodiment uses 2 flipstate modules, one that looks at the signals as if the card is inserted right side up and the other as if the card is inserted inverted. More specifically, with further reference to FIG. 29 and also to FIG. 26, the command signals 218 utilized by the orientation detection and state machine 212 comprise bus signals CE1#, CE2#, OE#, WE#, IORDN and IOWRN appearing on lines 252—257 in FIG. 29 connecting the pins 07, 42, 09, 15, 44 and 45 of connector 208, respectively, with corresponding pads on the ASIC 210. When these command signals are all static and in the inactive state, the PC Card bus is considered idle. The following algorithm looks at both the command signals and the Reset signal to determine whether or not the command signals are stable before and after Reset is asserted.

```
Bus is Idle = IORDN & IOWRN & WE# & (OE#|(CE1# & CE2#))
ASIC state machine pseudo code:
    STATE (RESET)
        Reset State is (NOT (Enough Time has Passed))
        IF the Bus is Idle THEN
            Increment the timer
        ELSE
            Reset the timer to 0.
        If~RESET and Enough Time has Passed THEN
            Reset the Timer
            Move to the NO_RESET State
    STATE (NO_RESET)
        Reset State is False
        IF the Bus is Idle THEN
            Increment the timer
        ELSE
            Reset the Timer
            IF NOT (Bus is Idle)
                Move back the RESET state
            IF Enough Time has Passed
                Move to the PASS state
    STATE (PASS)
        Reset the timer to 0
        Reset State is False
            IF NOT (Bus is Idle) THEN
                Move back to the RESET state
            ELSE
                IF the Other state machine's Reset State is True THEN
                Move to STATE MATCH
    STATE (MATCH)
        Timer is 0
        Reset State is False
        Found Orientation is True
```

Figure 30:
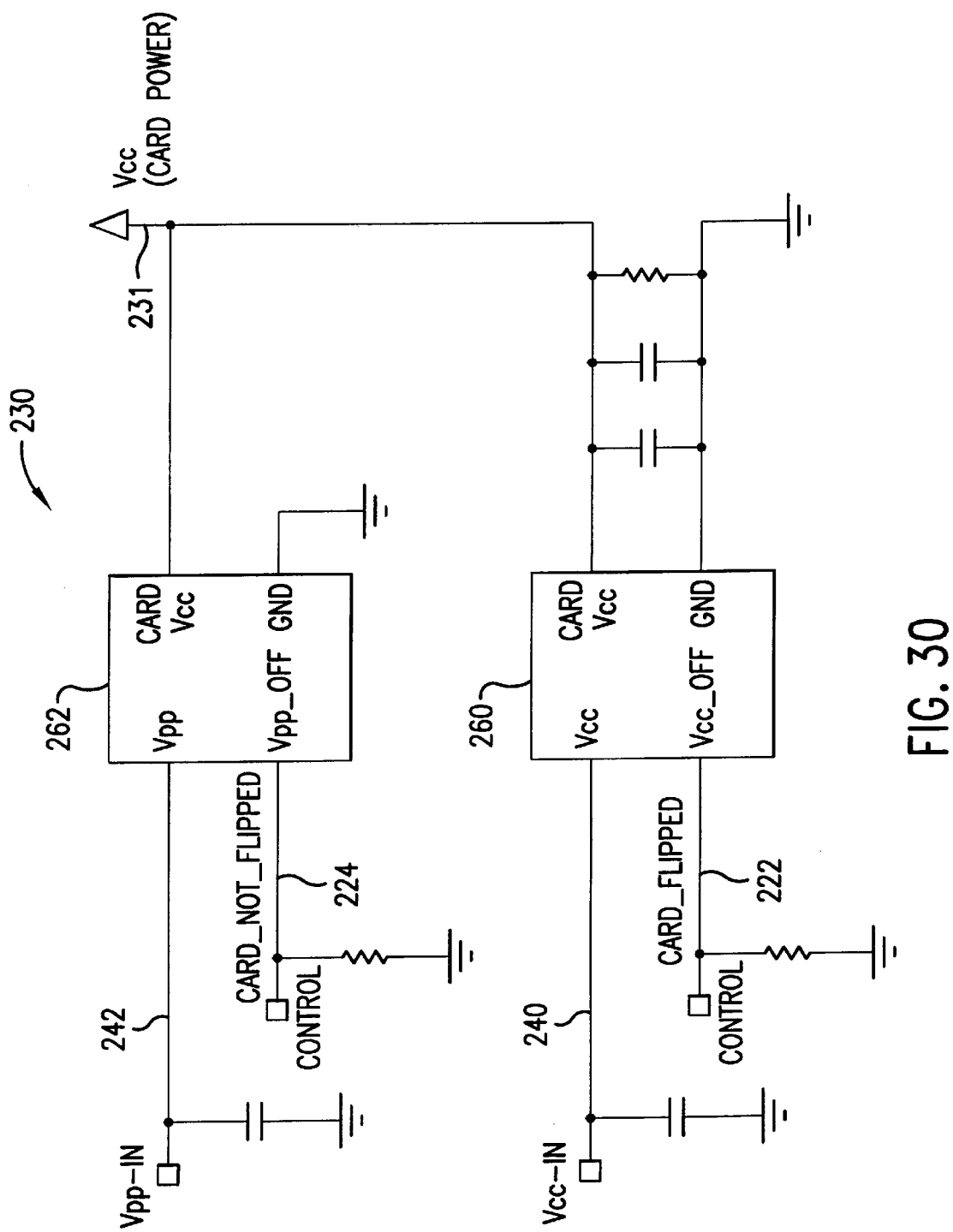
FIG. 30 is a schematic of a circuit for handling the Vpp and Vcc power supply voltages of invertible 16-bit PC Cards and 32-bit CardBus PC cards in accordance with the invention.

As already indicated, another design consideration for an invertible PC Card involves the power and ground connections on the slot. The ground signals line up properly when the card is inverted, but the power connections Vcc line up with Vpp connections. The Vpp signals may supply programming voltages from the host, and it is not desirable to have these connected to the PC Card power supply. Therefore, the circuit 230 is used to disconnect the Vpp source. With reference to FIG. 30, the ASIC supplies the orientation control signal Card_Flipped on line 222 to a first electronic switch means 260 connected to the Vcc pins on the 68-pin connector 208. The orientation control signal Card_Not_Flipped on line 224 is applied to a second electronic switch means 262 connected to the Vpp pins on the 68-pin connector 208. When the orientation is determined, the orientation control signals leave the Vcc source connected, and turn off the Vpp source.

Figure 31:
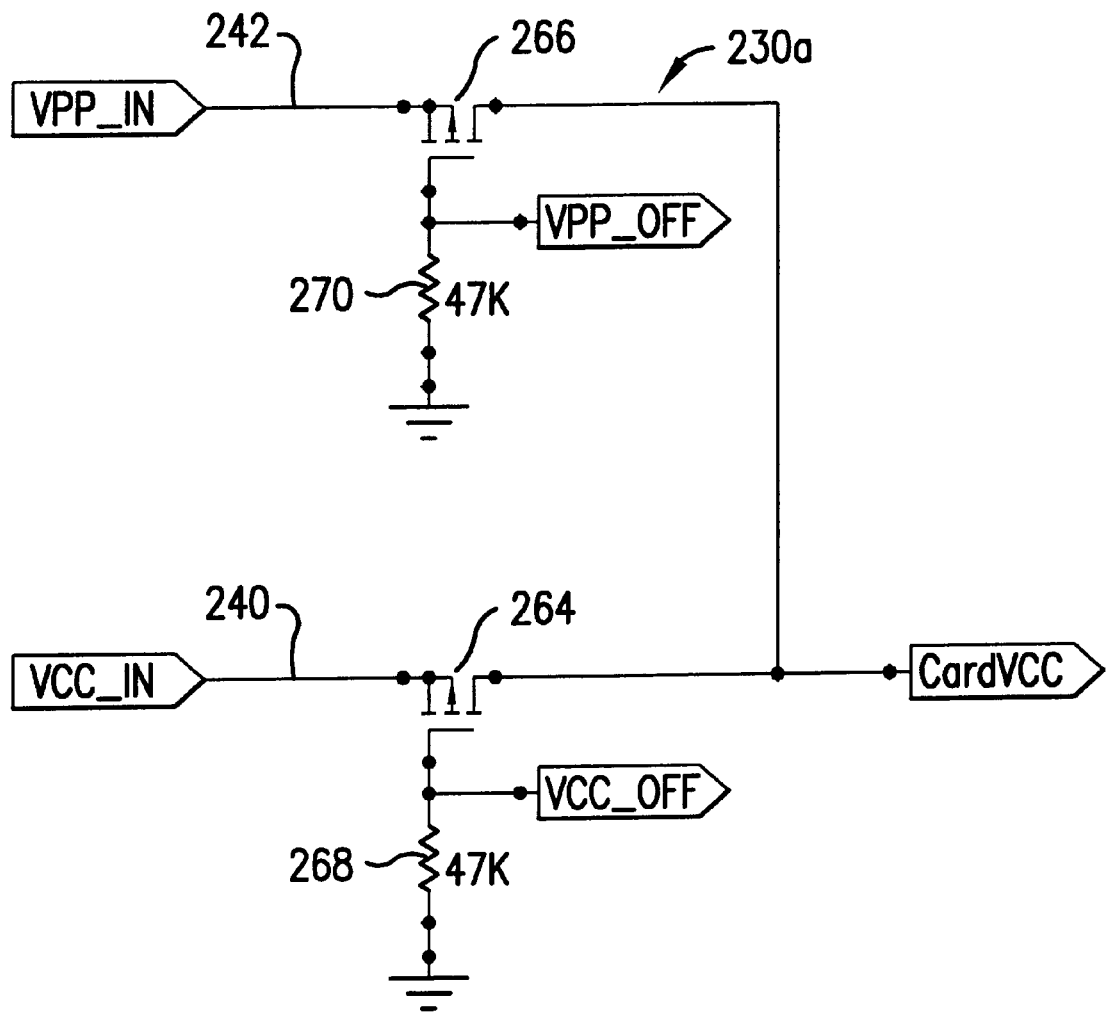
FIG. 31 is a schematic of a circuit for handling the Vpp and Vcc power supplies of a 16-bit, 5 volt invertible PC Card in accordance with the invention.

With reference to FIG. 31, there is shown a first embodiment 230a of the circuit 230 for use with the 16-bit invertible PC Cards, including p-channel MOSFETs 264 and 266. Both the Vpp and Vcc supplies to the PC Card are turned on at power-up of the PC Card. The Vpp and Vcc FETs 264 and 266 are passively turned on by pull down resistors 268 and 270, respectively. Thus, Card Vcc is supplied by both the Vcc and the Vpp host power supplies. The VppOff and VccOff signals from the ASIC are tri-stated until the ASIC determines the orientation of the PC Card in the slot. Once the ASIC determines the orientation of the PC Card, the ASIC will then turn off the FET 264 or 266 which is physically connected to the Vpp power pins of the card slot by forcing the appropriate control signal, Vpp_Off (Card_Not_Flipped) or Vcc_Off (Card_Flipped), to the card Vcc level. A requirement for the circuit to function properly is the use of FETs which do not have an internal drain-source back-gate diode. This will prevent any back drive of the unused power pin. Also, sufficient gate to drain voltage must be supplied to the FET to minimize the on state voltage drop across the FET.

C. Invertible 32-bit CardBus PC Cards

Figure 32:
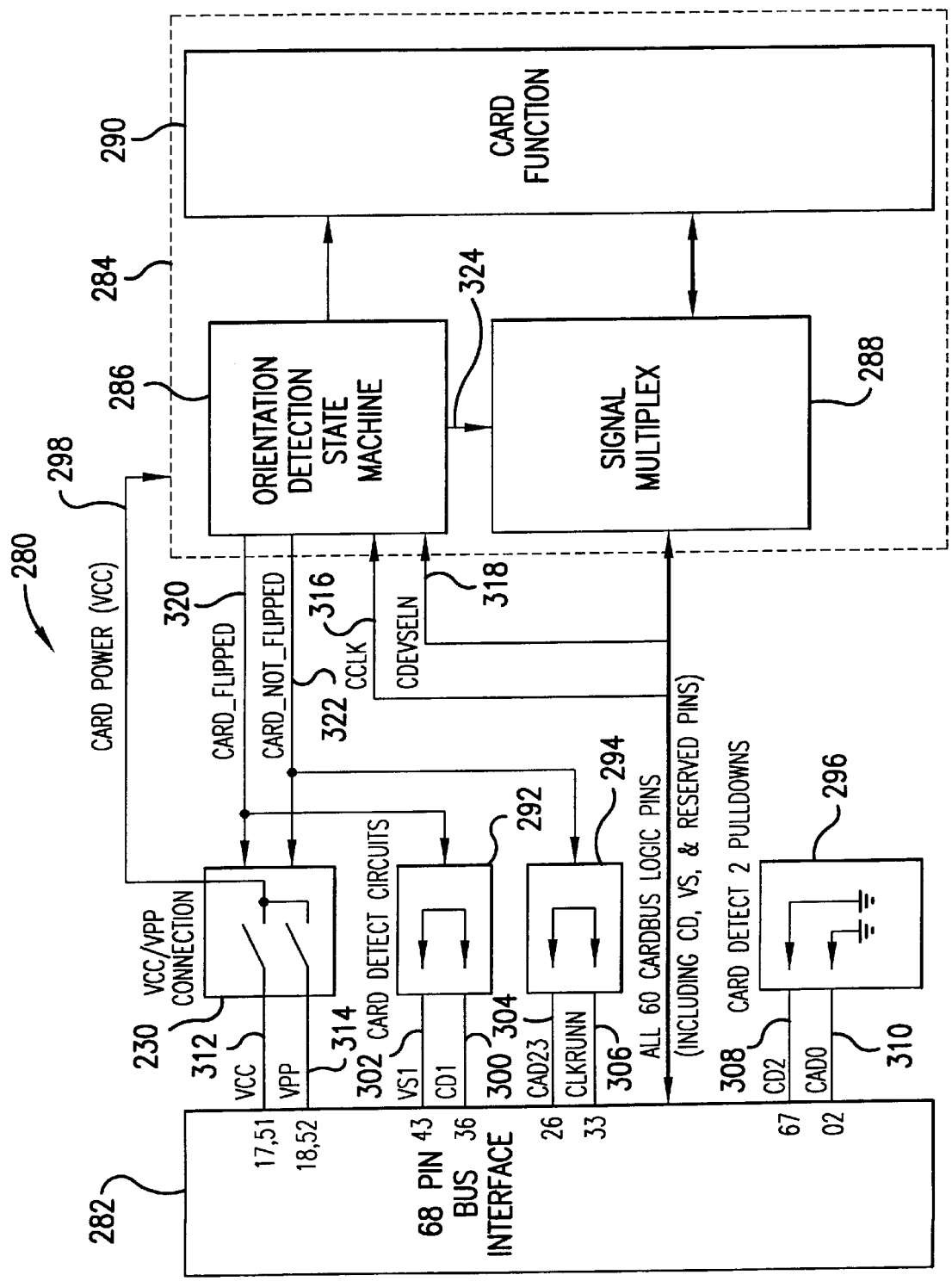
FIG. 32 is a functional block diagram of the circuitry incorporated in an invertible 32-bit CardBus PC Card in accordance with the invention.

With reference to FIG. 32, there is shown a functional block diagram of a system allowing a 32-bit CardBus PC Card 280 having a 68 contact I/O interface connector 282 (also called a 68-pin card connector herein) to be plugged into the PCMCIA slot of a host system in either right side up or inverted orientation. The system of FIG. 32 includes an ASIC 284 incorporating an orientation detection state machine 286, a signal multiplexer 288, and conventional card function circuits 290 including controller, interface and other adapter circuitry enabling the host system to be connected to information transfer systems such as Ethernet LANs and public switched telephone networks by means of standard modular RJ-45 and RJ-11 connectors.

The system of FIG. 32 further includes circuitry, external of the ASIC 284, including card presence and type detection circuits 292, 294 and 296, and a power connection circuit 230 (as already described) for providing the correct supply voltage (Vcc) to the card on the line 298 irrespective of card orientation. The card detection circuit 292 is connected to card detect CD1 (pin 36) and to VS1 (pin 43) on the 68-pin card connector 282, via lines 300 and 302, respectively. Card detection circuit 294 is connected to CAD23 (pin 26), and to ClkRunN (pin 33) via lines 304 and 306, respectively. Card detection circuit 296 is connected to CD2 (pin 67) and its (69-n) complement, CAD0 (pin 02), by lines 308 and 310, respectively. The power connection circuit 230 is connected to (a) both power supplies Vcc1 and Vcc2 (pins 17 and 51) via line 312, and to (b) both power supplies Vpp1 and Vpp2 (pins 18 and 52) via line 314. The orientation detection state machine 286 utilizes as an input the bus interface clock signal, CClk, and CdevSelN, the (69-n) complement thereof, appearing on lines 316 and 318 and generates orientation control signals 320 and 322 (Card_Flipped and Card_Not_Flipped) for controlling the external circuits 230, 292 and 294. The orientation detection state machine 286 also provides a card orientation signal 324 for controlling the signal multiplexer 288.

Figure 33A:
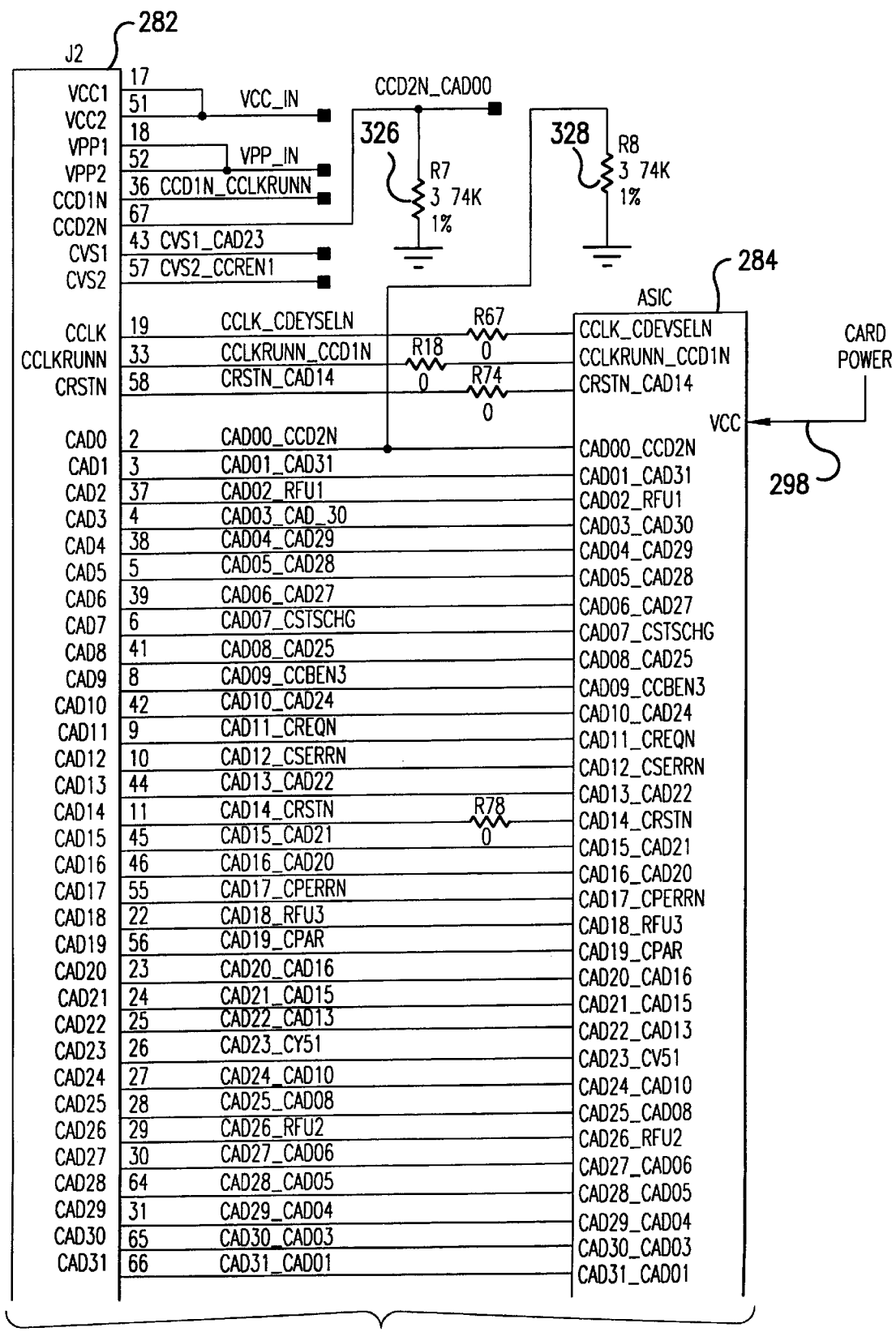
FIG. 33 is a top level schematic of the connections between the 68-contact connector and the ASIC in an invertible 32-bit CardBus card in accordance with the invention.
Figure 33B:
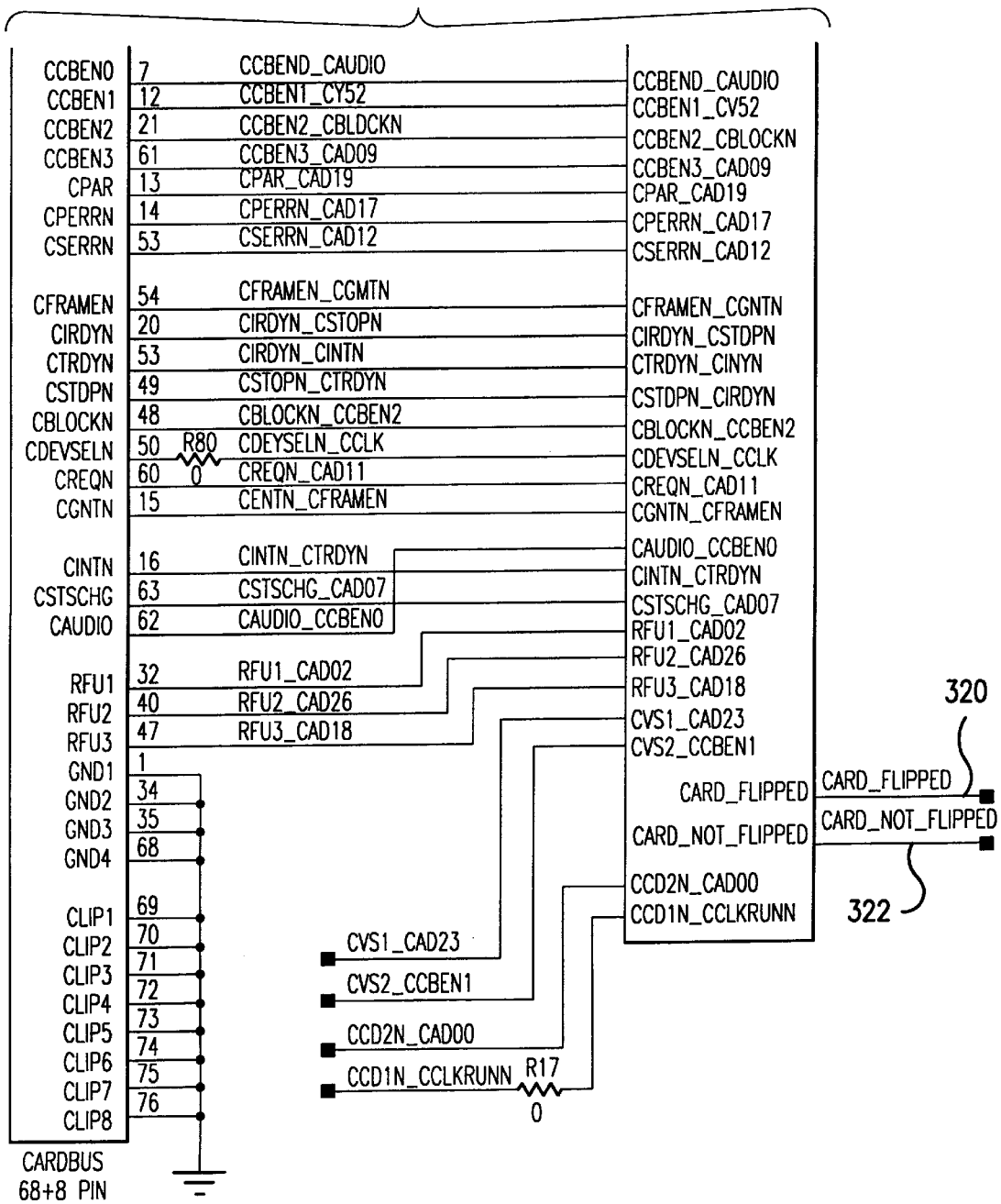

Turning now to FIG. 33, there is shown in greater detail the connections between the 68-pin connector 282 and the ASIC 284, which connections for the most part are self explanatory. As already indicated, for proper 32-bit CardBus detection, among other requirements, CD2 should be grounded. Accordingly, the card detection circuit 296 comprises a first pulldown resistor 326 connecting CD2 to ground and a second pulldown resistor 328 connecting CAD0 (complementary to CD2) to ground.

As already noted, for invertible 32-bit, 3.3V CardBus PC Cards, CD1 and VS1 should be shorted together to detect proper card insertion. To accomplish this, CD1 and VS1 and their complementary pin pairs, ClkRunN and CAD23, have special circuits 292 and 294 connected between them so they appear shorted when no power is applied to the chip, and open once power is applied and the ASIC takes over driving these signals. The circuit requirements are as follows: signal routing during card detection; signal isolation post detection; no external power supply required for card detection phase; and auto-switching to isolation mode on detection and power up.

Figure 34A:
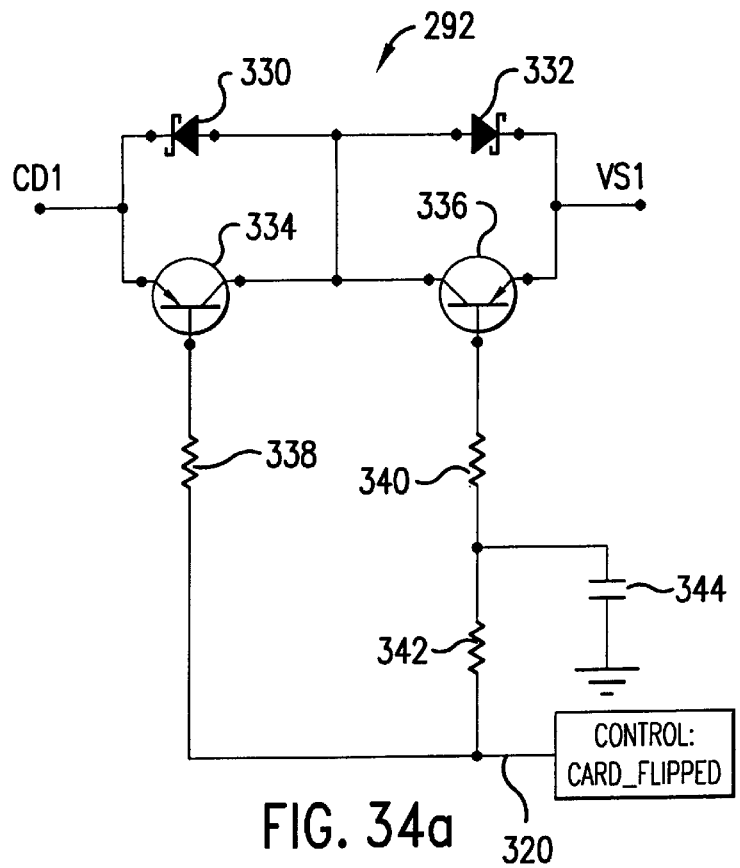
FIGS. 34a and 34b are schematic diagrams of a pair of invertible 32-bit CardBus orientation detection circuits.
Figure 34B:
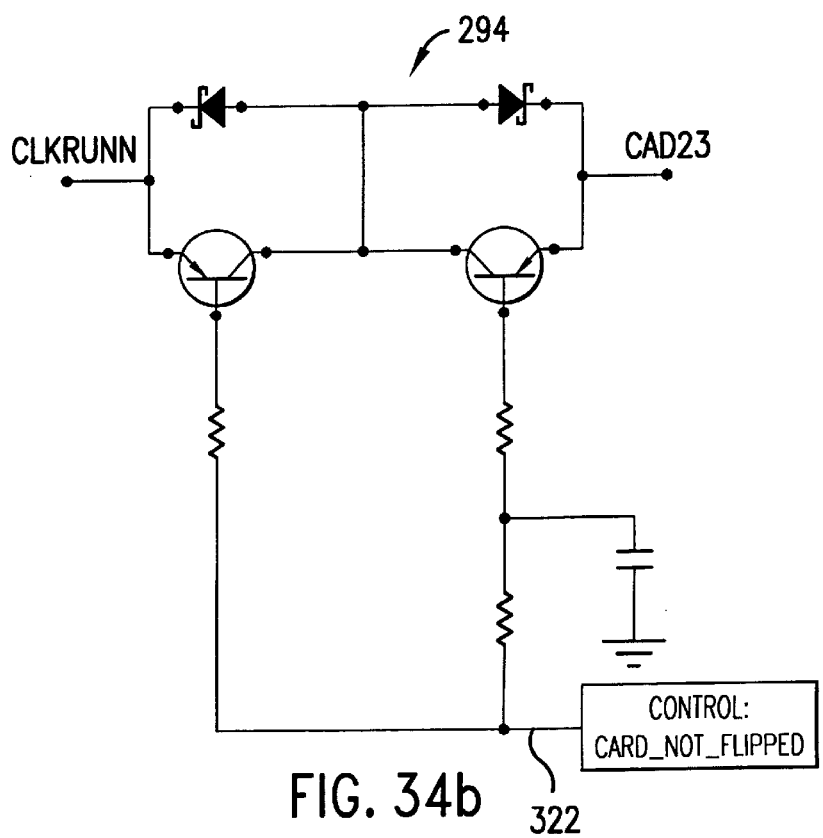
Figure 35A:
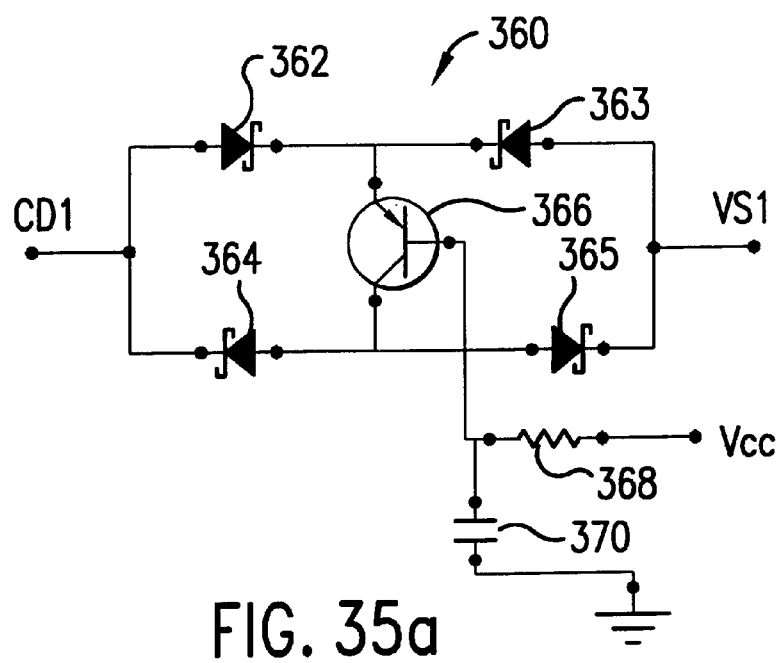
FIG. 35a and 35b are schematic diagrams of alternative embodiments of the invertible 32-bit CardBus orientation detection circuits of FIGS. 34a and 34b.
Figure 35B:
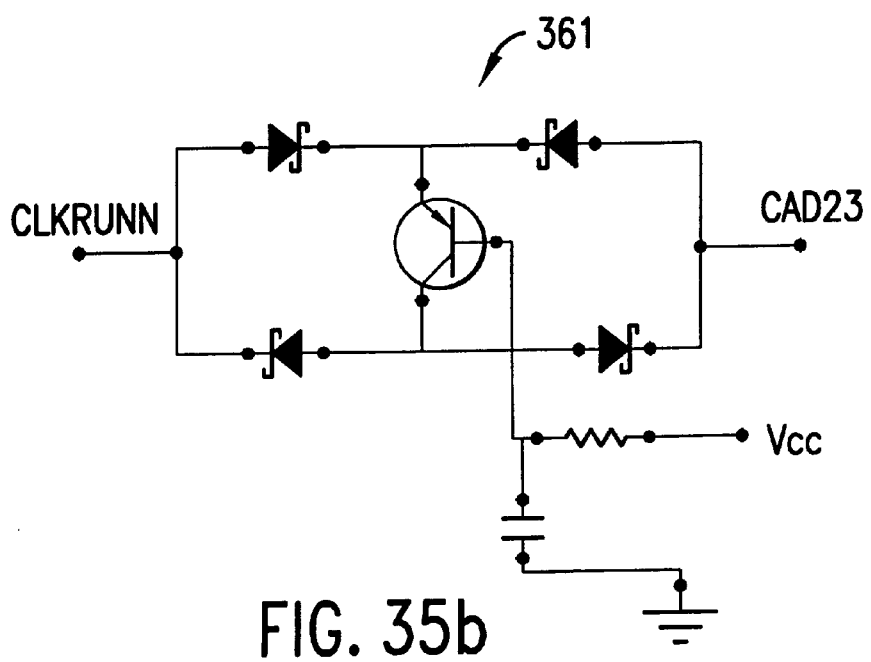

FIGS. 34a and 34b show implementations of circuits 292 and 294 in accordance with a preferred embodiment and FIGS. 35a and 35b show an alternative embodiment. The circuits of FIG. 34a and FIG. 34b are identical. The circuit of FIG. 34a is connected to the normal mode CD1/VS1 pin pair and the circuit of FIG. 34b is connected to the inverted or reverse mode complementary pin pair ClkRunN and CAD23.

Circuit 292, which will be taken as representative, consists of two Schottky diodes 330 and 332, and two bipolar PNP transistors 334 and 336. The collector terminals of the transistors 334 and 336 are connected together, and the diode 330 is connected across the emitter-collector terminals of transistor 334. Similarly, the diode 332 is connected across the emitter-collector terminals of the transistor 336. The emitter of transistor 334 is connected to pin CD1 of the 68-pin connector 282 while the emitter of transistor 336 is coupled to pin VS1 of the connector 282. The base or control node of each transistor 334 and 336 is connected to the Card__Flipped control output 320 of the orientation detection state machine 286 through a base bias network which in the case of the CD1 connected transistor 334 comprises simply a resistor 338. The VS1 connected transistor 336 has a tapped bias network comprising series resistors 340, 342 and a capacitor 344 to ground providing control of the circuit response time. The implementation of circuit 294 shown in FIG. 34b is identical to that of circuit 292 shown in FIG. 34a except that the bases of the transistors are coupled to the Card__Not__Flipped output 322 of the state machine 286.

In the operation of the circuits of FIGS. 34a and 34b, on insertion of the card into the host slot, the card detect pin sources current through the forward biased emitter base junction of one of the PNP transistors in the circuit 292 or 294 that is connected to the active pin pair. The inactive pair remains tri-state until completion of card detection. Current conducted through the emitter base junction of the transistor is conducted and limited by the base bias resistance to the control node of the ASIC. Since the card is not powered during the detection interval, and since the circuit load resistance is much smaller than the bias resistor value, the bias resistor is effectively returned to the cards signal ground through the ASIC control line 320 or 322. This arrangement provides a current sufficient to cause saturation of the emitter-to-collector junction of the PNP transistor and the bulk of the signal current is then conducted through the remaining forward biased diode to the voltage sense pin. In this embodiment, the Schottky diodes provide steering of signal currents around the parasitic collector base junction of the inactive PNP transistor. The circuit is bidirectional with respect to the CD1/VS1 current.

The host system detects the voltage rise at the card detect pin and energizes the card. After the ASIC device completes the power up sequence a logic level voltage at the control pin of the circuit determines which of the circuits 292, 294 remains in a conduction state and which is in the isolation state. For the circuit in the isolation state, the high logic level prevents further conduction through the emitter-base junction of the transistor and the device enters the off state, emitter to collector. This effectively isolates the signal path through the circuit. For the active one of the circuits 292, 294, a logic low level at the control pin maintains the circuit in the card detect phase. Provision is made in the ASIC to continue the active state of the card detect pins on application of power. Transition of the circuit from the detection phase is delayed by inclusion of the small valued capacitor 334 to card ground on the VS side of the circuit thus allowing for the power up timing of the ASIC interface device after application of power by the host.

Isolation is governed by the effective capacitance of the diodes and transistor acting in series/parallel between signal pins. Minimum junction capacitance and forward voltage drop governs selection of the diodes. Collector emitter capacitance, current gain, and saturation voltage similarly drive selection of the transistor. Unlike the alternative, two diode embodiment of FIGS. 35a and 35b, the embodiment of FIGS. 34a and 34b has a lower total voltage drop during the card detection phase due to the presence of a single Schottky diode and a single PNP transistor in the active conduction path.

FIGS. 35a and 35b show circuits 360 and 361 comprising an alternative to the embodiment of FIGS. 34a and 34b. As with the first embodiment of FIGS. 34a and 34b, the circuits of FIGS. 35a and 35b are identical, with the circuit 360 connected to the normal mode CD1/VS1 pin pair and the circuit 361 connected to the inverted or reverse mode complementary pin pair ClkRunN and CAD23. Representative circuit 360 consists of four Schottky diodes 362–365 and a bipolar PNP transistor 366 with a base bias resistor 368 connected to the card VCC rail. A small capacitor 370 couples the base of the transistor 366 to ground.

In the operation of the circuits of FIGS. 35a and 35b, upon insertion into the host slot, the card detect pin sources current through the forward biased diodes in the circuit 360 or 361 that is connected to the active card detection pin pair. The inactive pair remains tri-state until completion of card detection. Current conducted through the emitter-base junction of the transistor is conducted and limited by the base bias resistance to the VCC node of the card circuit. Since the card is not powered during the detection interval and since the circuit load resistance is much smaller than the bias resistor value the bias resistor is effectively returned to the cards signal ground. This arrangement provides a current sufficient to cause saturation of the emitter to collector junction of the PNP device and bulk of the signal current is then conducted through the remaining forward biased diode to the voltage sense pin. The circuit is bidirectional with respect to the CD1/VS1 current.

The host detects the voltage rise at the voltage sense pin and energizes the card. Application of voltage at VCC rail prevents further conduction through the emitter base junction of the transistor and the device enters the off state emitter to collector effectively isolating the signal path through both of the circuits 360 and 361, that is, that circuit connected to the active card detect pins and that circuit connected to bus signals. Provision is made in the card bus interface device to continue the active state of the card detect pins on application of power. Transition of the circuit from active to isolation is delayed by inclusion of the small valued capacitor 370 to card ground thus allowing for the power up timing of the cards bus interface device after application of power by the host.

Isolation is governed by the effective capacitance of the diodes and transistor acting in series/parallel between signal pins. Minimum junction capacitance and forward voltage drop governs selection of the diodes. Collector emitter capacitance, current gain, and saturation voltage similarly drive selection of the transistor.

With respect to card orientation detection for CardBus (32 bit) PC Cards, the system clock (CClk) is on pin 19 or pin 50, depending on the orientation. The functional circuits 290 are held in reset while the pins 19 and 50 are monitored by the orientation detection circuitry 286. When one of the signals has transitioned a certain number of times, that signal is identified as the clock and thus determines card orientation.

Figure 36:
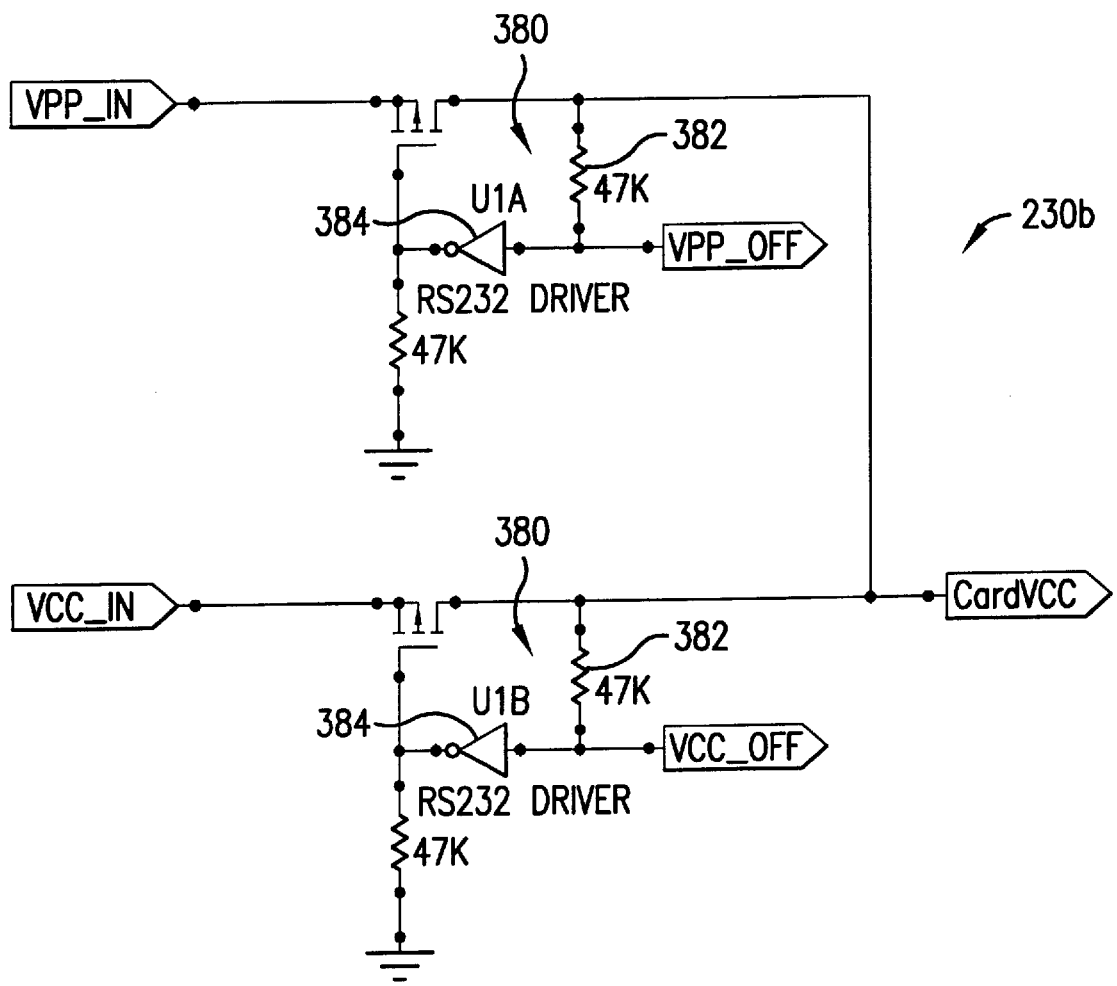
FIG. 36 is a schematic of a circuit for handling the Vpp and Vcc power supplies of a 32-bit, 3.3 volt invertible CardBus card in accordance with the invention.
Figure 37:
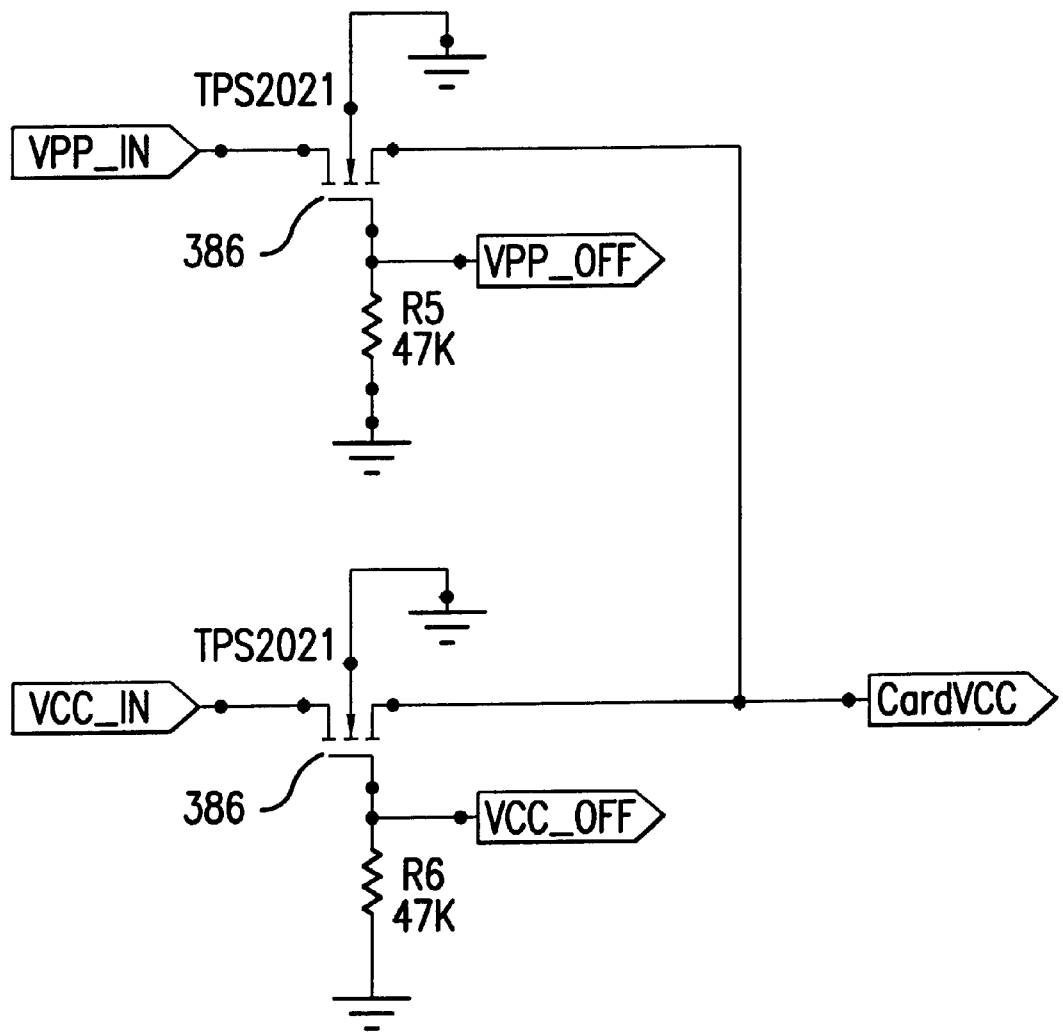
FIG. 37 is a schematic of a circuit for handling the Vpp and Vcc power supplies for both a 16-bit, 5 volt invertible PC Card and a 32-bit, 3.3 volt invertible CardBus card in accordance with the invention.

The invertible 32-bit CardBus card scheme utilizes the same basic power supply connection circuit 230 as that shown schematically in FIG. 30. A 32-bit 3.3V PC Card implementation of the circuit 230 is shown in FIG. 36. The circuit 230b of FIG. 36 is identical to the circuit 230a of FIG. 31 except that the circuit 230b includes a charge pump circuit 380 comprising the series combination of a resistor 382 and an inverter 384 connected across the gate-source terminals of the FETs, with the control signals Vpp_Off and Vcc_Off applied to the junction of the circuit elements 382 and 384. FIG. 37 shows yet another embodiment 230c of the power supply connection circuit 230 which may be used for both the 16-bit 5V and 32-bit 3.3V PC Card implementations. The embodiment of FIG. 37 uses Texas Instruments TPS2021 FETs 386 each of which contains an internal charge pump circuit and does not have an internal drain-source back-gate diode.

When power is removed from the card by the host or by removal from the host connect a loss of power occurs to the card. Restoration of the card circuits to the initial condition in a timely fashion is needed to permit a new detection cycle to begin. The behavior of the card circuits following loss of power can be characterized by an RC time constant where R is the nonlinear voltage versus current characteristic of the active circuits on the card and C is the total parallel capacitance of the card decoupling and bulk filter capacitors.

Figure 38A:
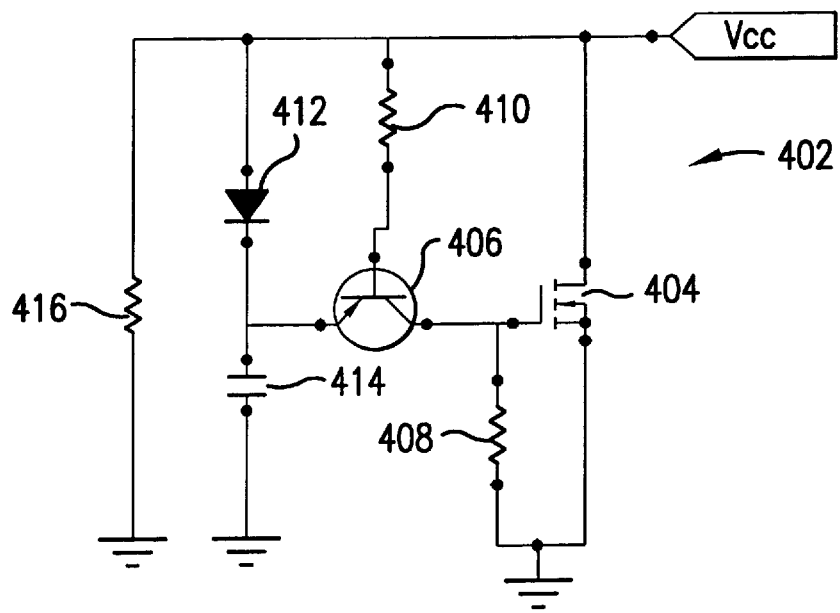
FIGS. 38a and 38b are schematic diagrams of circuits for managing invertible card power during the active-to-off transition.

In the case of 32-bit CardBus PC Cards, the behavior of the active circuits after power down requires a discharge mechanism to effectively reduce the RC time constant of the card to an interval less than the detection time. With reference to FIG. 38a, this is accomplished in the case of 32-bit CardBus cards using an active self triggered load circuit 402 connected between the card supply Vcc and ground. The circuit 402 comprises an n-channel MOSFET 404 and a bipolar PNP junction transistor 406. The MOSFET 404 includes a gate-biasing resistor 408 to ground. The transistor 406 includes a base-biasing resistor 410 coupled to card power supply Vcc. The series combination of a diode 412 and a capacitor 414 is coupled between Vcc and ground. On initial application of power, transistors 404 and 406 are in the off condition. The capacitor 414 acts as a storage capacitor and is charged via the diode 412 to the supply voltage, Vcc. A loss of voltage to the Vcc supply rail results in a net decay rate at Vcc which is initially controlled by the circuit loads. Capacitor 414 remains charged at a voltage equal to (Vcc–Vd) until a discharge path is presented. The discharge path occurs when conduction begins in transistor 406 as the supply decreases an amount equal to the forward bias voltage of the base-emitter junction. The current generated through transistor 406 generates a net voltage across resistor 408 at the gate of MOSFET 404. When the voltage across resistor 408 rises to the gate threshold voltage of MOSFET 404 a positive feedback mechanism is produced. As transistor 404 enters conduction the rate of decay in the Vcc voltage increases which in turn increases the effective voltage across the base circuit of transistor 406. The net decay rate is then governed by the on state resistance of the MOSFET channel (RDS on) (drain-source resistance when the FET is conducting fully) which can be on the order of milohms to ohms. A shunt load resistor 416 provides a discharge path below the cutoff voltage of the crowbar to insure that Vcc falls below the voltage at which the ASIC device is restored to its initial condition. In 32-bit CardBus applications the value of resistor 416 is typically of the order of 10K ohms.

Figure 38B:
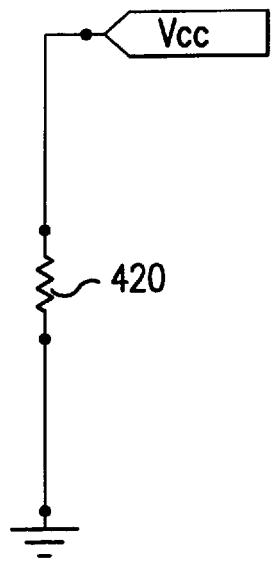

With reference to FIG. 38b, in the case of 16-bit cards, the decay rate and recovery mechanism on power off are sufficient to restore the initial condition with only a load resistor 420 present across the Vcc supply. Typical values of the order of 1K~10K ohm are used in practice for load resistor 420. This loading insures that the ASIC device is returned to the initial condition on power off with sufficient speed.

Once the proper orientation of an invertible PC is determined, the ASIC must drive or monitor the PC Card interface signals appropriately for normal operation. Therefore, the signals must be multiplexed for normal functionality and circuits 214 (FIG. 28) and 288 (FIG. 32) are provided for this purpose.

Figure 39:
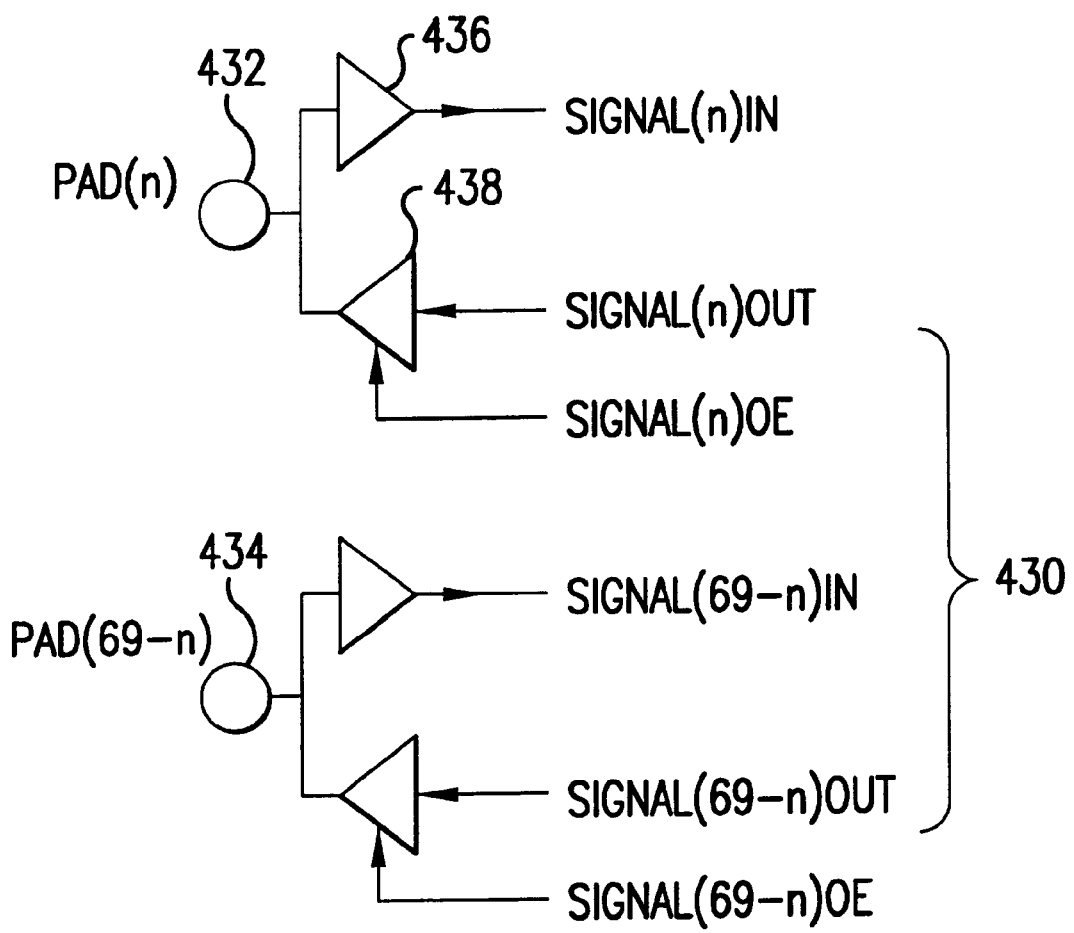
FIG. 39 is a schematic of a conventional PC Card ASIC pad driver circuit which does not allow for card inversion.

Without allowing card inversion, an ASIC would normally use a pad driver circuit 430 similar to the one shown in FIG. 39 for a bidirectional pin. The circuit 430 includes a pad 432 for connector pin (n), and a pad 434 for any other pin (69-n) on the 68 pin connector. Connected to the pad 432 is an input driver 436 for transmitting Signal(n)In from the pad and an output driver 438 for transmitting Signal(n)Out to the pad 432. If the signal is an output only or tri-stateable driver only, the input driver 436 would not be connected. Similarly, if it were an input only, the output driver 438 would not be connected. The output enable (OE) is used in a tri-stateable output driver, and is not used in an output only pad.

Allowing card inversion forces the ASIC to multiplex the signals in response to the orientation detected. This includes multiplexing the inputs from the pad, the outputs to the pad, and the output enables to the pad (for bidirectional pins).

Figure 40:
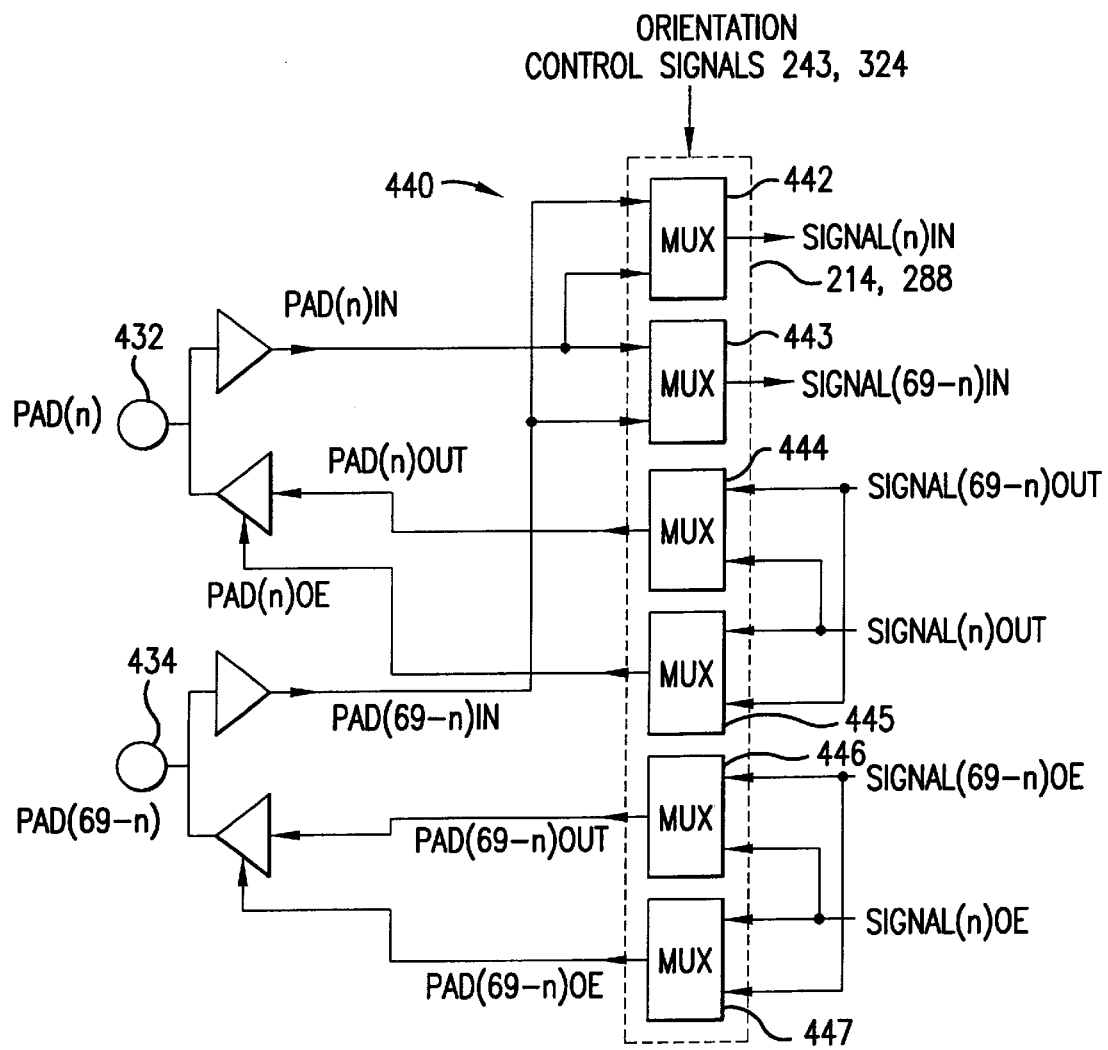
FIG. 40 is a schematic of an ASIC signal multiplexing circuit allowing for card inversion, in accordance with another aspect of the invention.

The circuit 440 of FIG. 40 is an implementation of the circuits 214 and 288 shown generally in FIGS. 28 and 36. The circuit 440 shows how the pads 432 and 434 are connected with muxes 442–447 for pin (n) which is multiplexed with signals on complementary pin (69-n) to permit selection of the right side up or inverted signal path in response to the orientation control signal. The input from pin (n) is multiplexed with the input from pin (69-n); the output to pin (n) is multiplexed with the output to pin (69-n); and the output enable (OE) going to pin (n) is multiplexed with the output enable going to pin (69-n). The muxes 442–447 are controlled by the orientation control signals from the orientation detection logic, which has determined whether pin (n) is connected to the bus, or pin (69-n).

While the present invention has been described with reference to particular illustrative embodiments, the invention is not intended to be restricted to those embodiments but only by the appended claims. It will be appreciated that those skilled in the art can change or modify the described embodiments, or substitute equivalents for the various elements described and shown, without departing from the scope and spirit of the invention.

What is claimed is:

1. A device adapted to be received by a slot in a host system for connecting the host system to an information transfer system, the device comprising:

a housing having a first portion and a second portion, the first portion of the housing having a longitudinal center line, parallel, longitudinally extending sides, a transverse front end and a rear end, the first portion of the housing further having a width conforming substantially to the PCMCIA card width standard and a height conforming substantially to the PCMCIA Type II card thickness standard, the second portion of the housing projecting rearwardly from the rear end of the first portion of the housing and having a height greater than that of the first portion of the housing and including at least one receptacle incorporating electrical contacts and adapted to receive a standard communications plug having electrical contacts for engaging the receptacle contacts whereby the device is directly connectable to the information transfer system, the second portion of the housing being positioned to one side of the longitudinal centerline and having a width no greater than one-half the width of the first portion of the housing;

a substrate enclosed within the housing, the substrate carrying circuit elements, the receptacle contacts being connected to circuit elements on the substrate; and a device connector mounted at the transverse front end of the first portion of the housing, the connector being electrically connected to circuit elements on the substrate and adapted to mate with a corresponding host connector within the slot of the host system.

2. A device, as defined in claim 1, in which:

the first portion of the housing has an overall length from the transverse front end to the rear end thereof that is no greater than the PCMCIA card length standard.

3. A device, as defined in claim 1, in which:

the second portion of the housing has a rear end and a height conforming substantially to the PCMCIA Type III card thickness standard, the housing having an overall length from the transverse front end of the first portion of the housing to the rear end of the second portion of the housing conforming substantially to the PCMCIA card length standard.

4. A device, as defined in claim 3, in which:

the at least one receptacle extends forwardly from the rear end of the second portion of the housing, the at least one receptacle being sized and configured to receive a standard RJ-type modular plug.

5. A device, as defined in claim 3, in which:

the device is stackable in complementary fashion with another, substantially identically configured device, with the first portion of the housing of one device overlying the first portion of the housing of the other device, the second portion of the housing of said one device being received in the space adjacent the second portion of the housing of said other device, whereby the overall height of the stacked devices substantially equals the PCMCIA Type III thickness standard, the stacked devices being so configured mechanically and electrically as to be receivable by the host system slot with either one device or the other device on top.

6. A device as defined in claim 1, in which:

the device is configured mechanically and electrically so as to be receivable by the host system slot either right side up or upside down.

7. A device, as defined, in claim 6, in which:

the device connector includes a plurality of contact positions adapted to mate with a plurality of contact positions on the host connector when the device is inserted in the slot, the host and device connectors being adapted to transfer bus interface signals between the host system and the device, the device being insertable in the host system slot in a first orientation in which the contact positions on the device connector are mateable with corresponding contact positions on the host connector, and in a second orientation in which the contact positions on the device connector are mateable with contact positions on the host connector that are complimentary to said corresponding contact positions;

a first circuit, said first circuit controlling the functions of device the first circuit including terminals corresponding to the contact positions of the host system connector, the first circuit being connectable to the information transfer system;

a second circuit, said second circuit being responsive to selected bus interface signals for generating orientation signals indicative of the orientation of the device in the host system slot; and a third circuit, said third circuit being interposed between the device connector and the first circuit and including first signal paths for transferring bus interface signals between contact positions on the device connector and the corresponding terminals of the first circuit when the device is inserted in the host slot in the first orientation, and second signal paths for transferring signals between contact positions on the device connector and terminals of the first circuit that are complementary to the corresponding terminals, the third circuit being responsive to the orientation signals to select the first or the second signals paths.

8. A device adapted to be received by a PCMCIA card slot in a host system for connecting the host system to an information transfer system, the PCMCIA card slot incorporating a pair of stacked slot connectors, the device comprising:

a housing having a first portion and a second portion, the first portion of the housing having a longitudinal centerline, parallel, longitudinally extending sides, a transverse front end and a rear end, the first portion of the housing further having a width conforming substantially to the PCMCIA card width standard and a height conforming substantially to the PCMCIA Type II card thickness standard, the second portion of the housing projecting rearwardly from the rear end of the first portion of the housing and having a height greater than that of the first portion of the housing and including at least one receptacle incorporating electrical contacts and adapted to receive a standard communications plug having electrical contacts for engaging the receptacle contacts whereby the device is directly connectable to the information transfer system, the second portion of the housing being positioned to one side of the longitudinal center line and having a width no greater than one-half the width of the first portion of the housing;

a substrate enclosed within the housing the substrate carrying circuit elements, the receptacle contacts being connected to circuit elements on the substrate; and a device connector mounted at the transverse front end of the first portion of the housing, the connector being electrically connected to circuit elements on the substrate and adapted to mate with one or the other of the pair of connectors within the slot of the host system.

9. A device as defined in claim 8, in which:

the device is configured mechanically and electrically as to be receivable by the host system slot either oriented right side up or upside down, the device connector being mateable with one of the pair of slot connectors when oriented right side up and the other of the pair of slot connectors when oriented upside down.

10. A device, as defined in claim 8, in which:

the first portion of the housing has an overall length from the transverse front end to the rear end thereof that is no greater than the PCMCIA card length standard.

11. A device, as defined in claim 8, in which:

the second portion of the housing has a rear end and a height conforming substantially to the PCMCIA Type III card thickness standard, the housing having an overall length from the transverse front end of the first portion of the housing to the rear end of the second portion of the housing conforming substantially to the PCMCIA card length standard.

12. A device, as defined in claim 11, in which:

the at least one receptacle extends forwardly from the rear end of the second portion of the housing, the at least one receptacle being sized and configured to receive a standard RJ-type modular plug.

13. A device, as defined, in claim 11, in which:

the device is stackable in complementary fashion with another, substantially identically configured device, with the first portion of the housing of one device overlying the first portion of the housing of the other device, the second portion of the housing of said one device being received in the space adjacent the second portion of the housing of said other device, whereby the overall height of the stacked devices substantially equals the PCMCIA Type III thickness standard, the stacked devices being so configured mechanically and electrically as to be receivable by the host system slot and to mate with both of the pair of connectors in the slot with either one device or the other device on top.

14. A device adapted to be received by a PCMCIA slot in a host system, the device being adapted to interconnect the host system with an information transfer system, the host system slot containing a host connector having a plurality of contact positions, the device comprising:

a housing having an end including a device connector mateable with the host connector when the device is inserted in the host system slot, the device connector having a plurality of contact positions, the host and device connectors being adapted to transfer bus interface signals between the host system and the device, the device being insertable in the host system slot in a first orientation in which the contact positions on the device connector are mateable with corresponding contact positions on the host connector, and in a second orientation in which the contact positions on the device connector are mateable with contact positions on the host connector that are the compliments of said corresponding contact positions;

a first circuit, said first circuit controlling the functions of the device, the first circuit including terminals corresponding to the contact positions of the host system connector, the first circuit being connectable to the information transfer system;

a second circuit, said second circuit being responsive to selected bus interface signals for generating orientation signals indicative of the orientation of the device in the host system slot; and a third circuit, said third circuit being interposed between the device connector and the first circuit and including first signal paths for transferring bus interface signals between contact positions on the device connector and the corresponding terminals of the first circuit when the device is inserted in the host slot in the first orientation, and second signal paths for transferring signals between contact positions on the device connector and terminals of the first circuit that are the complements of the corresponding terminals, the third circuit being responsive to the orientation signals to control the selection of the first or the second signals paths.

15. A device in accordance with claim 14, in which:

each of the host and device connectors have 68 contact positions for transferring bus interface signals conforming to the PCMCIA PC Card standard.

16. A device in accordance with claim 14, in which:

the third circuit comprises a signal multiplexer controlled by the orientation signals.

17. A device in accordance with claim 14, in which:

the second circuit is responsive to clock signals from the host system for generating said orientation signals.

18. A device in accordance with claim 14, in which:

the second circuit is responsive to selected command signals from the host system for generating said orientation signals.

19. A device in accordance with claim 14, in which:

the contact positions include device detection contacts for transmitting bus interface signals indicative of device presence and type;

and in which the device further includes:

device detection circuitry coupled to the device detection contacts of the device connector, whereby the host system detects the presence and type of device irrespective of the orientation of the device.

20. A device in accordance with claim 14, further including:

a circuit responsive to the orientation signals for transmitting a device power supply voltage to power the device irrespective of device orientation.

21. A device in accordance with claim 14, in which:

the device connector includes a top surface and a bottom surface, each of said surfaces carrying a ground plate adapted to engage ground contacts within the host system slot, the ground plate carried by the top surface being electrically connected with the ground plate carried by the bottom surface.

* * * * *